(12) United States Patent
Tully et al.

(10) Patent No.: US 12,078,677 B1
(45) Date of Patent: Sep. 3, 2024

(54) MEASURING INPUT RECEIVER THRESHOLDS USING AUTOMATED TEST EQUIPMENT DIGITAL PINS IN A SINGLE SHOT MANNER

(71) Applicant: Amazon Technologies, Inc., Seattle, WA (US)

(72) Inventors: Brendan Tully, Phoenix, AZ (US); Amandeep Saluja, Austin, TX (US)

(73) Assignee: Amazon Technologies, Inc., Seattle, WA (US)

(*) Notice: Subject to any disclaimer, the term of this patent is extended or adjusted under 35 U.S.C. 154(b) by 539 days.

(21) Appl. No.: 17/305,048

(22) Filed: Jun. 29, 2021

(51) Int. Cl.
G01R 31/317 (2006.01)
G01R 31/3177 (2006.01)

(52) U.S. Cl.
CPC . *G01R 31/31724* (2013.01); *G01R 31/31727* (2013.01); *G01R 31/3177* (2013.01)

(58) Field of Classification Search
CPC ........ G01R 31/31724; G01R 31/31727; G01R 31/3177
See application file for complete search history.

(56) References Cited

U.S. PATENT DOCUMENTS

| | | | | |
|---|---|---|---|---|
| 7,046,014 | B2* | 5/2006 | Lu | G01R 31/31932 324/76.13 |
| 2008/0092005 | A1* | 4/2008 | Huott | G01R 31/318572 714/E11.16 |
| 2020/0256914 | A1* | 8/2020 | Bismuth | G01R 31/2886 |
| 2021/0382101 | A1* | 12/2021 | Bismuth | G01R 27/2605 |

* cited by examiner

*Primary Examiner* — Son T Le
*Assistant Examiner* — Brian Butler Geiss
(74) *Attorney, Agent, or Firm* — Weaver Austin Villeneuve & Sampson LLP

(57) ABSTRACT

Techniques for determining the input threshold voltage level of an integrated circuit device may include configuring a voltage drive level and a load current for a tester channel of automated test equipment (ATE) connected to an input pin of an integrated circuit device, and executing a test pattern. The test pattern may include test vectors for generating a set of voltage ramps at the input pin by the tester channel using the load current and the voltage drive level. The set of voltage ramps can be characterized by different lengths and different amplitudes. The test pattern may also include test vectors for checking output values on an output pin of the integrated circuit device after each voltage ramp of the set of voltage ramps. The input threshold voltage level of the input pin can be determined based on results of executing the test pattern.

20 Claims, 12 Drawing Sheets

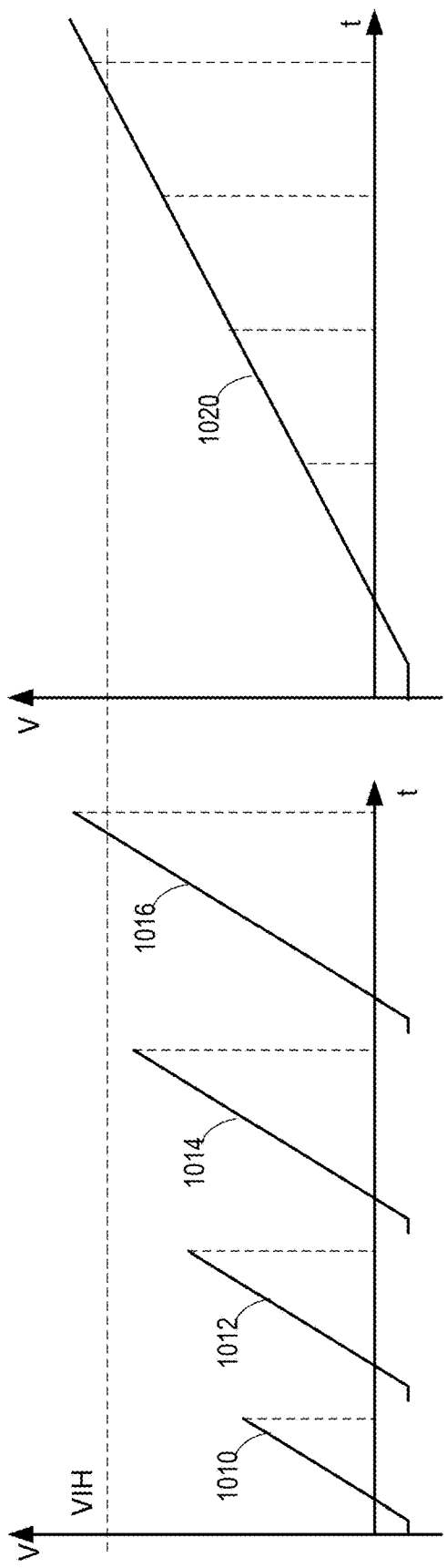
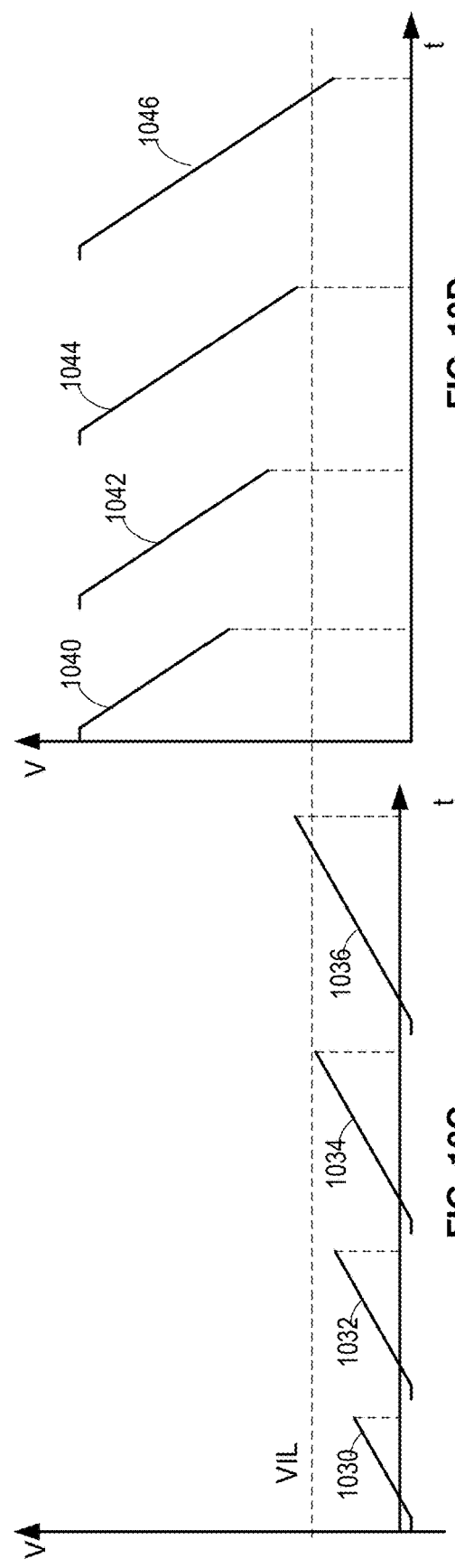

US 12,078,677 B1

MEASURING INPUT RECEIVER THRESHOLDS USING AUTOMATED TEST EQUIPMENT DIGITAL PINS IN A SINGLE SHOT MANNER

BACKGROUND

An electrical device may receive an input signal on an input pin and generate an output signal based on the input signal. For example, a digital electronic device may respond to an input signal based on whether the input signal level is a logic high ("1") or a logic low ("0"). The digital electronic device may determine whether the received input signal is a logic high or a logic low based on the input voltage level and a reference signal level (e.g., a threshold level). The minimum input voltage level above which the digital electronic device may identify the input signal as a logic high is generally referred to as the VIH (logic high input voltage) of the digital electronic device. The maximum input voltage level below which the digital electronic device may identify the input signal as a logic low is generally referred to as the VIL (logic low input voltage) of the digital electronic device. The VIH and VIL of input pins of digital electronic devices may vary for different input receiver (or input buffer) designs, dimensions of the input receivers, materials, processing technologies, supply voltages levels, temperatures, noise levels, and the like. For digital electronic devices to function properly under various operation conditions, the voltage levels of the input signals to the input pins of the digital electronic device may need to be above the VIH levels for logic high inputs and may need to be below the VIL levels for logic low inputs. Thus, the output signal levels of a driving circuit that drives a digital electronic device and the electrical interconnects between the driving circuits and the digital electronic device may need to meet certain specifications in order to properly drive the digital electronic device.

Manufacturers of electronic devices generally provide various direct current (DC) and alternating current (AC) specifications of a device, including the VIH and VIL specifications, such that users may choose proper devices and design proper driving circuits for driving these devices based on their specific applications. Manufacturers of electronic devices and/or users of the electronic devices may perform various DC and AC tests on the electronic devices to ensure that the electronic devices meet the specifications and/or design margin, before shipping the electronic devices to customers or before integrating the electronic devices into custom systems.

BRIEF DESCRIPTION OF THE DRAWINGS

Various embodiments in accordance with the present disclosure will be described with reference to the drawings, in which:

FIG. 10A illustrates an example of a series of voltage ramps generated at an input pin for measuring the logic high input voltage (VIH) level of the input pin according to certain embodiments;

FIG. 10B illustrates an example of a voltage ramp generated at an input pin for measuring the VIH level of the input pin according to certain embodiments;

FIG. 10C illustrates an example of a series of voltage ramps generated at an input pin for measuring the logic low input voltage (VIL) level of the input pin according to certain embodiments;

FIG. 10D illustrates another example of a series of voltage ramps generated at an input pin for measuring the VIL level of the input pin according to certain embodiments;

DETAILED DESCRIPTION

Figure 1A:
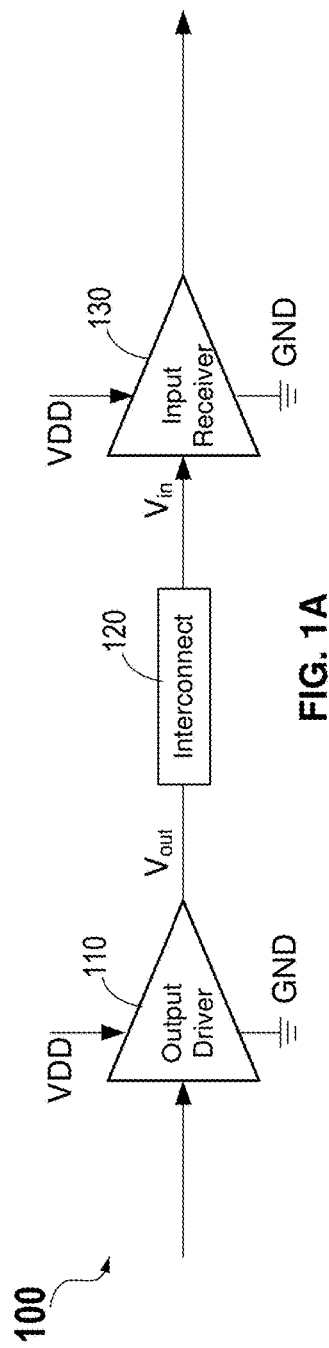
FIG. 1A illustrates a simplified example of a system including a digital device driven by outputs of another digital device.

Techniques disclosed herein relate generally to integrated circuit testing. More specifically, disclosed herein are techniques for measuring input characteristics of digital input pins of integrated circuits using automated test equipment in, for example, mass production test. Various inventive embodiments are described herein, including devices, systems, structures, methods, processes, test vectors, program code, computer-readable storage media, and the like.

Electronic devices are usually tested before they are put on market and/or before they are integrated into custom systems, to ensure that the electronic devices have the desired functionality and performance as described in device datasheets, design documents, or other specification documents. Device specifications may include various functional, direct current (DC), or alternating current (AC) specifications, such as current I voltage signal levels, timings, operation frequency ranges, current consumption, leakage, linearity, signal-to-noise ratio, and the like. For example, input threshold voltage levels of input receivers on input pins of a digital device are often tested to make sure that the input receivers can correctly recognize logic high signals (corresponding to digital values "1s") and logic low signals (corresponding to digital values "0s") that may have voltage levels between the positive supply voltage (e.g., VDD) and the ground (or the negative supply voltage), such that the device can respond to the input signals (e.g., toggle the output signal) accordingly.

The input threshold voltage levels of an input receiver of a digital input pin in an electronic device (e.g., a semiconductor integrated circuit) may include the logic high input voltage (VIH) level and the logic low input voltage (VIL) level. VIH level is generally referred to the minimum input voltage level of an input signal above which the input receiver may consistently interpret the input signal as a logic high ("1"), and VIL level is generally referred to the maximum input voltage level of an input signal below which the input receiver may consistently interpret the input signal as a logic low ("0"). VIH and VIL levels are often measured during characterization test, using devices from different process corners and under different operation conditions (e.g., different supply voltages and different temperatures). For example, the VIH and VIL levels of an input pin may be measured on automated test equipment (ATE) systems (also referred to as testers) by executing a test pattern using different (e.g., linearly increasing or decreasing or binarily varying) input signal levels for the input pin, to search (e.g., linearly or binarily) for input signal levels corresponding to the transition point between passes and fails of the test pattern. The VIH and VIL levels may need to be measured separately for each input pin using this technique. The characterization results may be used to determine the specifications of the device. The characterization test can measure the VIH/VIL levels, but it generally takes a long time, such as seconds, tens of seconds, minutes, or even hours, in order to test all pins under different operation conditions at high voltage resolutions. Due to the long test time, these tests are generally not performed in production test (e.g., for screening defect devices). During production test, to reduce test time and cost, signals from tester channels on pin electronics cards of an ATE system that drive the input pins of the device under test (DUT) may be configured to have strong logic low levels (e.g., higher than the specified or guaranteed VIL level) and weak logic high levels (e.g., lower than the specified or guaranteed VIH level) determined based on the specification or design target, and then a functional test pattern may be executed by the tester to apply digital input data at the set voltage levels to the input pins and verify that the digital outputs from the device output pins have expected logic (e.g., high or low) values. If the test pattern passes on the DUT, the DUT may meet the VIH/VIL specification. Otherwise, the DUT may not meet the VIH/VIL specification and may be rejected. This test may be referred to as a go-no-go test because it does not measure the actual VIH and VIL levels of the input pins.

In many applications, it may be desirable to measure the VIH/VIL levels in a short test time (and thus at a low test cost) in production test, rather than or in addition to the go-no-go test. For example, VIH/VIL levels may be measured on devices from different process lots to track variations in the fabrication process, which may affect other characteristics of the manufactured devices, such as speed, time margin (e.g., setup time or hold time), leakage current, power consumption, or reliability. Measured VIH/VIL levels may also show how close the VIH/VIL levels of the devices are to the specification and the distribution of the VIH/VIL levels. The changes in the measured VIH/VIL levels after stress tests or other reliability tests may indicate the durance, reliability, and life time of the devices.

According to certain embodiments, pin electronics of digital tester channels of an ATE system may be used to apply a load current to push or pull the device pin to a terminating voltage (typically when ATE channel is configured as a logic receiver), and effectively drive logic high/low voltage signals according to a test pattern. Through the physical property of charging a capacitor denoted by $$I = C\frac{dv}{dt}$$

(where I is the test load current, and C is the combined capacitance of the tester channel, device input, and interconnect), dt can be modulated to achieve various dv values. Thus, sections of test vectors can be used to generate a set of voltage ramps of different amplitudes at each input pin of the device under test (DUT). The voltage ramps in the set of voltage ramps may be arranged based on an ascending order or a descending order of the amplitudes, or may be arranged in any other order. The amplitude (or the peak or minimum voltage level) of a voltage ramp can be controlled by the load current (and thus the slope of the voltage ramp) and the length of the voltage ramp. The length of a voltage ramp can be controlled by, for example, the number of test vectors (or clock cycles) in a corresponding section of the test pattern and the cycle time of the clock signal for running the test vectors. When a same load current is used to generate the set of voltage ramps, the slopes of the voltage ramps in the set of voltage ramps may be about the same due to the same capacitive loading at the input pin. One of the set of voltage ramps or an additional voltage ramp may be a calibration voltage ramp that can be used for calibrating the slope of the voltage ramps at each input pin, where the slope of the voltage ramps may depend on the loading (e.g., capacitive loading) at the input pin and the load current applied by the pin electronics. Other voltage ramps in the set of voltage ramps may be used to drive the input pin with input signals having different peak or minimum voltage levels. After each voltage ramp, the outputs of the device may be compared with the expected output values specified in the test pattern to determine whether an input threshold voltage level has been reached based on whether the corresponding test vectors pass or fail.

The input threshold voltage levels (e.g., VIH/VIL levels) may be determined based on the results of the execution of the sections of the test pattern, such as the vector numbers (or clock cycle numbers) of the passing and/or failing test vectors, where the vector numbers of the passing and/or failing test vectors may be used to identify the voltage ramps that cause the passing or failing of the test vectors. The lengths of the voltage ramps identified based on the passing test vectors (e.g., the first or last passing test vector) and/or the failing test vectors (e.g., the first or last failing test vector) may be determined based on the respective numbers of clock cycles used to generate the respective voltage ramps. The amplitude (or peak or minimum voltage level) of an identified voltage ramp may be determined based on the length of the voltage ramp and the slope of the voltage ramp. An input threshold voltage level (e.g., VIH/VIL level) may be between the peak (or minimum) voltage level of a voltage ramp (e.g., the first or the last voltage ramp) that reaches the input threshold voltage level and thus would cause the corresponding test vectors to pass, and the peak (or minimum) voltage level of a voltage ramp (e.g., the last or the first voltage ramp) that fails to reach the input threshold voltage level and thus would cause the corresponding test vectors to fail.

In one example, to generate the calibration voltage ramp and calibrate the slope of the voltage ramps on an input pin of a DUT under a certain load current, a tester channel connected to the input pin may be controlled using a test pattern to apply an initial signal level at the input pin in a drive mode, and then strobe the voltage level at the input pin a receive mode. In the receive mode, the tester channel may apply an active load current (e.g., a source current or a sink current) on the input pin of the DUT to charge or discharge the input pin, and use a pair of comparators to compare the voltage level at the input pin in each clock cycle against a VOH (output high voltage) level and a VOL (output low voltage) based on the test pattern. When the voltage level at the input pin in a clock cycle (corresponding to a test vector) is between the VOL level and VOH level, the corresponding test vector may fail because the voltage level strobed in the clock cycle is not below the VOL level (and thus is not a logic low) and is not above the VOH level (and thus is not a logic high), such that the voltage level is not at a valid digital value. The number of failing clock cycles (or test vectors) may indicate the time for the tester channel to charge the voltage level at the input pin from VOL to VOH or the time for the tester channel to discharge the voltage level at the input pin from VOH to VOL.

The test pattern may include multiple sections for generating multiple voltage ramps having similar slopes but different lengths and thus different peak (or minimum) voltage levels. In each section, the test pattern and each tester channel for a group of input pins under test may be configured to drive an initial signal level in a drive mode (bringing all inputs under test to a static initial voltage), and then the tester channel may be changed to a receive mode. In the receive mode, the tester channel may apply an active load current on the corresponding input pin to charge (or discharge) the input pin. During the charging or discharging of the input pin, the tester channel may not strobe the signal level at the input pin using the pair of comparators or may not care about the signal level at the input pin (e.g., the test vectors may have values "X" (do not care)). The input pin may be charged or discharged by the active load current in each clock cycle, such that the signal level at the input pin may gradually increase or decrease to generate a ramp signal at the input pin. At the end of the voltage ramp, the signal level at the input pin may be sensed by the input receiver of the input pin to detect a logic input value (e.g., "1" or "0"). The multiple sections of the test pattern may have different numbers of test vectors (or test clock cycles if one or more test vectors are repeated or looped), such that the lengths and peak voltage levels of the voltage ramps may be different (e.g., linearly increase or decrease). The peak voltage level of each voltage ramp may be determined based on the calibrated slope and the length of the voltage ramp (e.g., determined based on the number of vectors or clock cycles in the respective section of the test pattern and the cycle time of each clock cycle).

The test pattern may also include, after each section of test pattern for generating the respective voltage ramp, test vectors including expected output values at the output pins of the DUT. A test vector associated with an input pin may pass if the corresponding voltage ramp reaches an input threshold voltage level of the input pin such that the DUT may generate the expected output value at an output pin, for example, using a boundary scan circuit. A test vector associated with an input pin may fail if the voltage ramp at the input pin does not reach the input threshold voltage level of the input pin and thus the DUT may not generate the expected output value at the output pin. Based on the locations of the passing test vectors and/or the failing test vectors, an ATE system may determine which voltage ramps reached the input threshold voltage level and which voltage ramps did not reach the input threshold voltage level, and determine the input threshold voltage level based on the peak voltage levels of the voltage ramps that reached the input threshold voltage level and the peak voltage levels of the voltage ramps that did not reach the input threshold voltage level.

The test pattern may include sections of test vectors for generating a respective set of voltage ramps for measuring the VIL level of each input pin using a respective tester channel, and may also include sections of test vectors for generating a respective set of voltage ramps for measuring the VIH level of each input pin using the respective tester channel. In this way, the input threshold voltage levels (e.g., both the VIH level and the VIL level) of an input pin may be determined by running the test pattern once and inferring the input threshold voltage levels based on the passing or failing vector locations or clock cycles. Input threshold voltage levels of multiple input pins (e.g., all input pins or input pins in a pin group) may be determined by running the test pattern once and inferring the input threshold voltage levels based on the passing or failing vector locations associated with each of the multiple input pins.

In one specific example, to measure the VIH level of an input pin, the load current and the test pattern may be configured such that the lengths and amplitudes of the voltage ramps in a set of voltage ramps may gradually increase. When the length and height of the voltage ramp is low, the input receiver of the input pin may not detect a logic high, and thus the test vectors including expected output values for a high input stimulus may fail. As the lengths and heights of the voltage ramps gradually increase while subsequent sections of the test pattern are executed, the peak voltage levels of the voltage ramps may start to reach the VIH level and the input receiver of the input pin may start to detect a logic high at a certain point, and thus the test vectors including expected output values for a high input stimulus may start to pass. Based on the number of clock cycles used to generate the voltage ramp that causes the test vectors including expected output values for a high input stimulus to start to pass, the length (cycle time) of each clock cycle, and the slope of the voltage ramp determined based on a calibration voltage ramp, the lowest signal level of input signals that can cause the test vectors to pass may be determined and used as the VIH level of the input pin. For example, the VIH level may be between a minimum value of the peak voltage levels of the voltage ramps that reached the VIH level and a maximum value of the peak voltage levels of the voltage ramps that did not reach the VIH level.

Techniques disclosed herein may be used to measure the input threshold voltage levels (e.g., VIH/VIL levels) of multiple input pins by executing a single test pattern for only one time, and thus may be used in mass production test to reduce the test time and the test cost and improve the throughput. As described above, the actual VIH/VIL levels measured on a large number of devices from different production lots may be used to track variations in the fabrication process, may show how close the VIH/VIL levels of the devices are to the specification and the distribution of the VIH/VIL levels, and may indicate the reliability and life time of the devices.

As used herein, a test vector may refer to a vector that includes logic values (e.g., logic "1" and logic "0") to be applied to input pins of a device under test (DUT) by an ATE system, and expect logic values (e.g., logic H, logic low, valid, and do-not care "X") on output pins of the DUT to be checked by the ATE system. A test pattern may include many test vectors. The pins of the DUT may be grouped into pin groups, and the test pattern may specify values for individual pins and/or values for individual pin groups. The test vectors may use a same time setting (sometimes referred to as a timeset) or different time settings (e.g., multiple timesets), where each timeset may have a respective combination of a clock cycle time, rise/fall times for input signals, strobe times for output signals, and the like. Some test patterns may include instruction codes. The instruction codes may be used to, for example, repeat a test vector for multiple times or loop multiple test vectors for a certain number of times or based on certain conditions. Thus, the test vector number of a test vector in a test pattern may be different from the clock cycle number of a clock cycle in which the test vector is executed.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

In analog circuits, the voltage or current level of an output signal may change linearly or nonlinearly with the change in input signals. A change in the input signals may generally cause a change in the output signal level. In contrast, a digital device may respond similarly to signals with signal levels in a range, based on whether the input signal level is a logic high ("1") or a logic low ("0"). The digital device may determine whether the received input signal is a logic high or a logic low, for example, based on the input voltage level and reference signal levels. Input signals with signal levels above a reference signal level may cause the digital device to generate the same output signal. Similarly, input signals with signal levels below a reference signal level may cause the digital device to generate the same output signal. Thus, digital devices may be less susceptible to noise in, for example, the power distribution network and the signal path. When an input signal level is within a certain range (e.g., a mid-band), the input receiver of an input pin of the digital device may not deterministically or consistently recognize the input signal as a logic high or a logic low. The minimum input voltage level of an input signal above which the input receiver of an input pin may interpret the input signal as a logic high is generally referred to as the VIH level of the input pin. The maximum input voltage level of an input signal below which the input receiver of an input pin may interpret the input signal as a logic low is generally referred to as the VIL level of the input pin. The VIH/VIL levels for different input pins of a digital device may be different.

FIG. 1A illustrates an example of a simplified system 100 including a digital device 130 driven by outputs of another digital device 110. Digital device 130 may be electrically connected to digital device 110 through an electrical interconnect 120. The output signal Vout from an output driver of digital device 110 may be between the VDD level and the GND (or VSS) level, and may be attenuated by electrical interconnect 120. In some cases, the output signal levels and/or the driving capability (e.g., output current) of digital device 110 may not be high enough, the loss on the electrical interconnects may be high, and there may be signal integrity issues due to, for example, supply voltage fluctuations and noises on the signal paths. As such, the voltage level Vin of the input signal at an input pin of digital device 130 may be much lower than the signal level of output signal Vout. For digital device 130 to properly interpret input signal Vin, the logic high voltage level of Vin may need to be higher than the VIH level of the input pin and the logic low voltage level of Vin may need to be lower than the VIL level of the input pin.

Figure 1B:
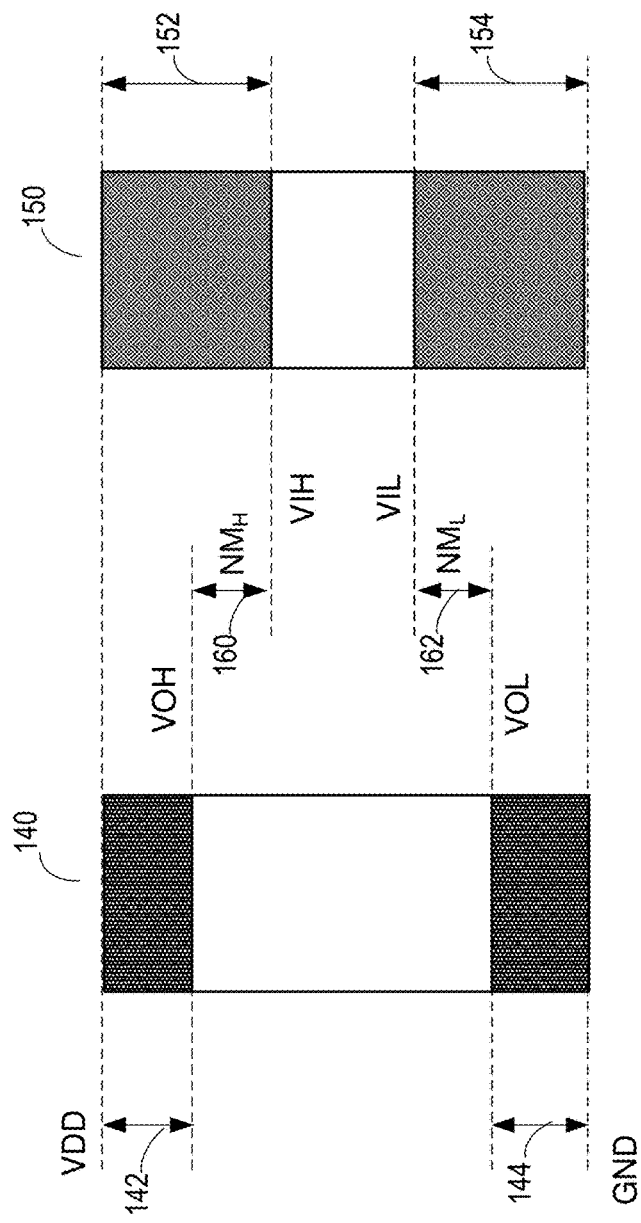
FIG. 1B illustrates input and output signal levels of interconnected digital devices and the corresponding noise margins.

FIG. 1B illustrates input and output signal levels of interconnected digital devices and the corresponding noise margins. A diagram 140 in FIG. 1B shows the voltage levels of output signal Vout from digital device 110. The voltage level of a logic high output from digital device 110 may be within a range 142, where the maximum voltage level of the logic high output may be VDD and the minimum voltage level of the logic high output may be VOH. The voltage level of a logic low output from digital device 110 may be within a range 144, where the maximum voltage level of the logic low output may be VOL and the minimum voltage level of the logic low output may be GND (or VSS).

A diagram 150 in FIG. 1B shows the voltage levels of valid input signals Vin to digital device 130. For example, the voltage level of a valid logic high input signal to digital device 130 may be within a range 152, where the maximum voltage level of the valid logic high input signal may be VDD and the minimum voltage level of the valid logic high input signal may be VIH. The voltage level of a valid logic low input signal to digital device 130 may be within a range 154, where the maximum voltage level of the valid logic low input signal may be VIL and the minimum voltage level of the valid logic low input signal may be GND (or VSS). Thus, the noise margin $NM_H$ for a logic high input signal may be shown by a voltage range 160, and the noise margin NML for a logic low input signal may be shown by a voltage range 162. When the total loss due to the loss on electrical interconnect 120 and other noise is greater than noise margin $NM_H$, a logic high output signal from digital device 110 may not be properly recognized as a logic high signal by digital device 130. Similarly, when the total noise is greater than noise margin $NM_L$, a logic low output signal from digital device 110 may not be properly recognized as a logic low signal by digital device 130. To design a robust system having sufficient noise margins between devices, the VIH/VIL levels of input pins of the devices may need to be more precisely determined and guaranteed.

Although VIL and VIH levels are often defined in the device specification as part of DC characteristics, VIL and VIH levels may be verified by performing a functional test. The functional test may be performed by applying input signals with signal levels determined based on values defined in the device specification, and then executing a functional test pattern to verify that the device can correctly recognize the applied input signals to generate expected output signals. If the test pattern passes on a device, the device has operated correctly and meets the VIL/VIH specifications. If the test pattern fails on a device, the device may not meet the VIL/VIH specification. This functional VIL/VIH test may be performed in production test to guarantee that the input pins meet the VIL/VIH specifications. In some cases, the VIL/VIH test may be performed at both a low VDD (e.g., the minimum operating VDD defined in the specification) and a high VDD (e.g., the maximum operating VDD defined in the specification).

Modern integrated circuits often include design-for-test (DFT) circuits that can facilitate the testing of the integrated circuits. These DFT circuits may include scan chains, build-in self-test (BIST) circuits, boundary scan circuits, and the like. For example, many devices may incorporate the IEEE 1194.1(JTAG) boundary scan interface, to simplify the test and characterization of input receivers and output drivers, including DC parameters such as VIH, VIL, VOH, and VOL. Boundary scan circuits may be implemented at the boundary (e.g., input pins and output pins) of a device to provide controllability, accessibility, and observability to input receivers and output drivers. Boundary scan circuits may include a boundary scan cell (BSC) added at every digital input/output pin of a device, where the BSCs of the digital input//output pins may be daisy-chained to form a boundary scan chain. During the VIL/VIH test, signals with specified VIL/VIH levels are applied to the device input pins, the input states (e.g., input logic values) detected by the input receivers are latched into the corresponding BSCs, and the input states stored in the BSCs may be shifted out of the boundary scan chain, for example, one in each clock cycle, for observation. Thus, input states detected by the input receivers can be directly observed, rather than being indirectly inferred from output values at the output pins of the device after the input states detected by the input receivers propagate through the internal logic of the device. Boundary scan techniques can also support board-level tests, such as IC interconnect testing, IC cluster testing, identifying missing and wrong components, and identifying fixture problems. For example, boundary scan techniques may be used to test the connections of devices on a printed circuit board (PCB) or a system, where the boundary scan chains of the devices may be connected to form a longer boundary scan chain.

Figure 2:
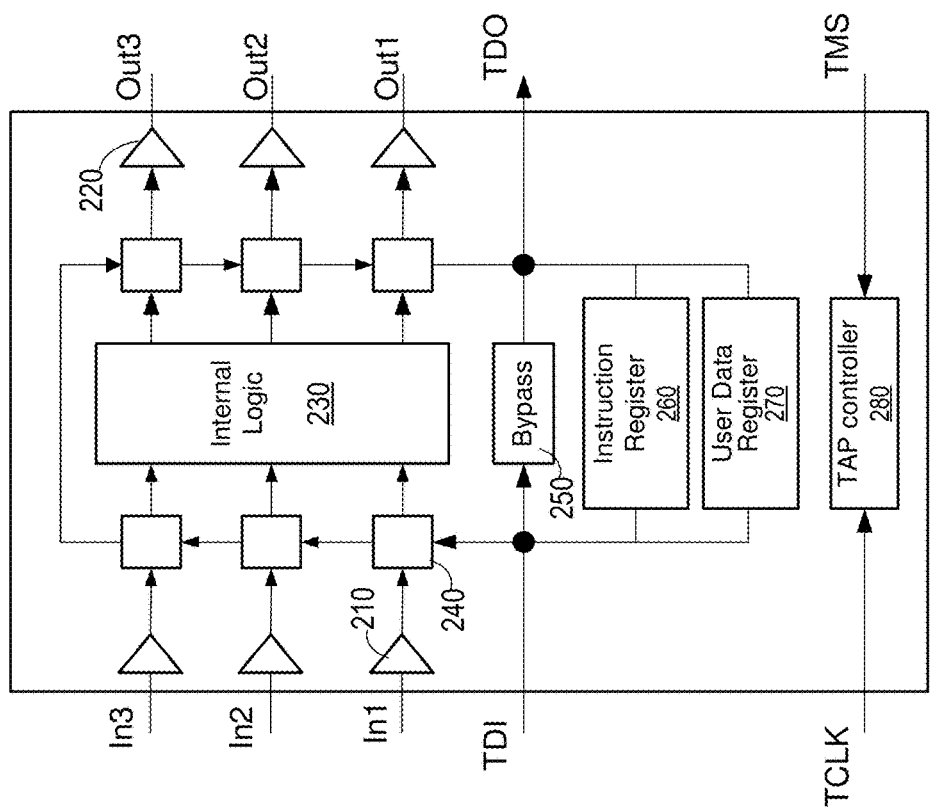
FIG. 2 illustrates a simplified example of a digital device including boundary scan circuits.

FIG. 2 illustrates a simplified example of a digital device 200 including boundary scan circuits. In the illustrated example, digital device 200 may include a set of primary input pins (e.g., pins In1, In2, In3), a set of primary output pins (e.g., pins Out1, Out2, Out3), and internal logic 230 that may perform the designed functions. Each primary input pin may include an input receiver 210, which may receive an input signal, interpret the input signal as a logic high or logic low, and generate an internal input state (e.g., logic high or logic low). Each primary output pin may include an output driver 220 that may have a certain driving capability for driving circuits down the stream in the signal path.

As illustrated in FIG. 2, digital device 200 may also include boundary scan circuits that include a series of boundary scan cells 240 and boundary scan logic. In the illustrated example, there may be one BSC 240 for each primary input pin or primary output pin. BSCs 240 for the primary input pins and primary output pins are daisy chained to form a scan chain, where the BSC 240 at the start of the scan chain may be connected to a test data input (TDI) pin and the BSC 240 at the end of the scan chain may be connected to a test data output (TDO) pin. Each BSC 240 may include a scan input, a scan output, a primary input, and a primary out. The primary input may be connected to input receiver 210 and the primary output may be connected to internal logic 230. The scan input pin of a BSC may be connected to the TDI pin or to the scan output pin of the preceding BSC in the chain, and the scan output pin of a BSC may be connected to the TDO pin or to the scan input pin of the following BSC in the chain. Each BSC may include a boundary scan register (BSR) for storing the detected input state, and may be bypassed in normal functional mode such that the primary input of BSC 240 may be connected to the primary output of BSC 240 to send the input state detected by an input receiver 210 to internal logic 230.

The boundary scan logic may generally include a test access port (TAP) controller 280, an instruction register 260, an optional user data register 270, and a bypass circuit 250 that may pass the input from the TDI pin to the TDO pin. TAP controller 280 may be a test interface and may be controlled by a clock signal TCLK and a test mode selection signal TMS. Clock signal TCLK may be used to control the timing of the boundary scan circuit. For example, the TDI pin may shift values into the boundary scan registers at the rising edge of clock signal TCK, whereas the selected register contents may be shifted out on the TDO pin at the falling edge of clock signal TCK. Test mode selection signal TMS may be used to manage the TAP controller state machine. In some implementations, an optional reset signal TRST may be used. Instruction register 260 and the optional user data register 270 may be on separate scan paths between the TDI pin and the TDO pin, such that TAP controller 280 may select and shift either instructions or user data.

Under normal operations, BSCs may be set to the bypass mode so that they may not affect the normal operations of the device, and input states detected by the input receivers may pass through the BSCs to internal logic 230. When the device is set to a test mode, the boundary scan cells may store input states detected by the input receivers, or may store logic data serially shifted in through the scan chain (e.g., to set up internal states in the device). Input states stored in the boundary scan registers may also be serially shifted out to the TDO pin. The data or states output from the TDO pin may be monitored and compared with expected values to determine if the input receivers function properly.

Figure 3:
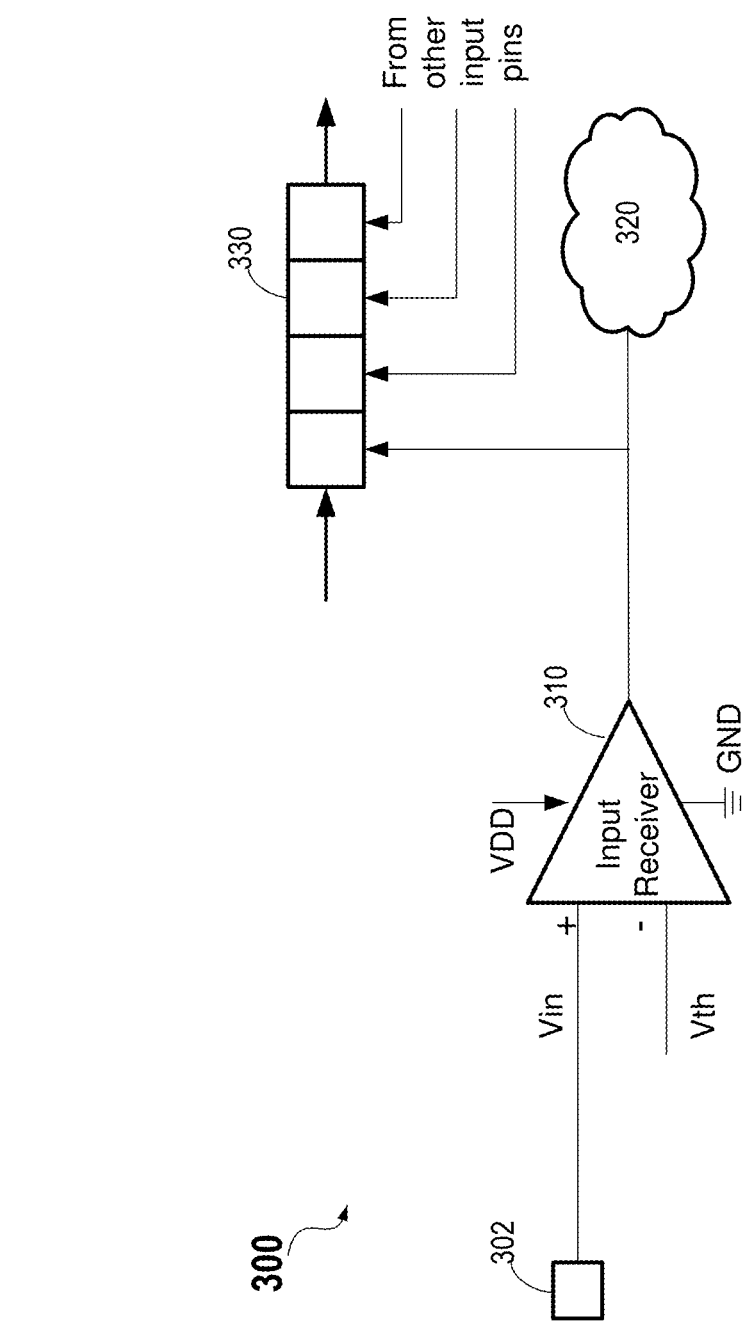
FIG. 3 illustrates an example of a method of testing a digital input pin of a device including boundary scan registers.

FIG. 3 illustrates an example of a method of testing a digital input pin of a device 300 including boundary scan registers. The digital input pin may include an input pad 302, an input receiver 310, and a boundary scan cell that includes a boundary scan register 330. Input receiver 310 may include a comparator where one input to the comparator may be an input signal Vin from input pad 302 and another input to the comparator may be a reference signal (e.g., a threshold voltage Vth). The VDD of device 300 may be, for example, about 1.8 V, about 1.5 V, or about 1.2 V, and the threshold voltage Vth may be, for example, about 0.6 V. When the input signal Vin (e.g., driven by a tester channel) is greater than the threshold voltage Vth, such as at about 0.95 V, input receiver 310 may output a logic high. When the input signal Vin is lower than the threshold voltage Vth, such as at about 0.35 V, input receiver 310 may output a logic low. The output value from input receiver 310 may be sent to internal logic 320 during normal operations, and may be sent to boundary scan register 330 during device test. Due to noises in device 300, such as voltage level fluctuations on the power distribution network and noises in other circuits (e.g., the reference voltage generation circuit), the threshold voltage Vth may vary. Thus, if the voltage level of an input signal is close to the nominal threshold voltage (e.g., about 0.6 V), input receiver 310 may generate either a logic high output or a logic low output. Other input pins may have the same circuitry, and the boundary scan registers 330 of the input pins may be arranged into a daisy chain or a shift register. Input states detected by input receivers 310 and stored in the boundary scan registers 330 may be shifted out to the TDO pin of device 300 as described above. To measure the VIL/VIH levels of the input pins by an ATE system using the boundary scan circuits described above, a test pattern may be used to force input signals on the input pins, shift out input states detected by the input pins, and measure output data at the TDO pin.

Figures 4A, 4B:
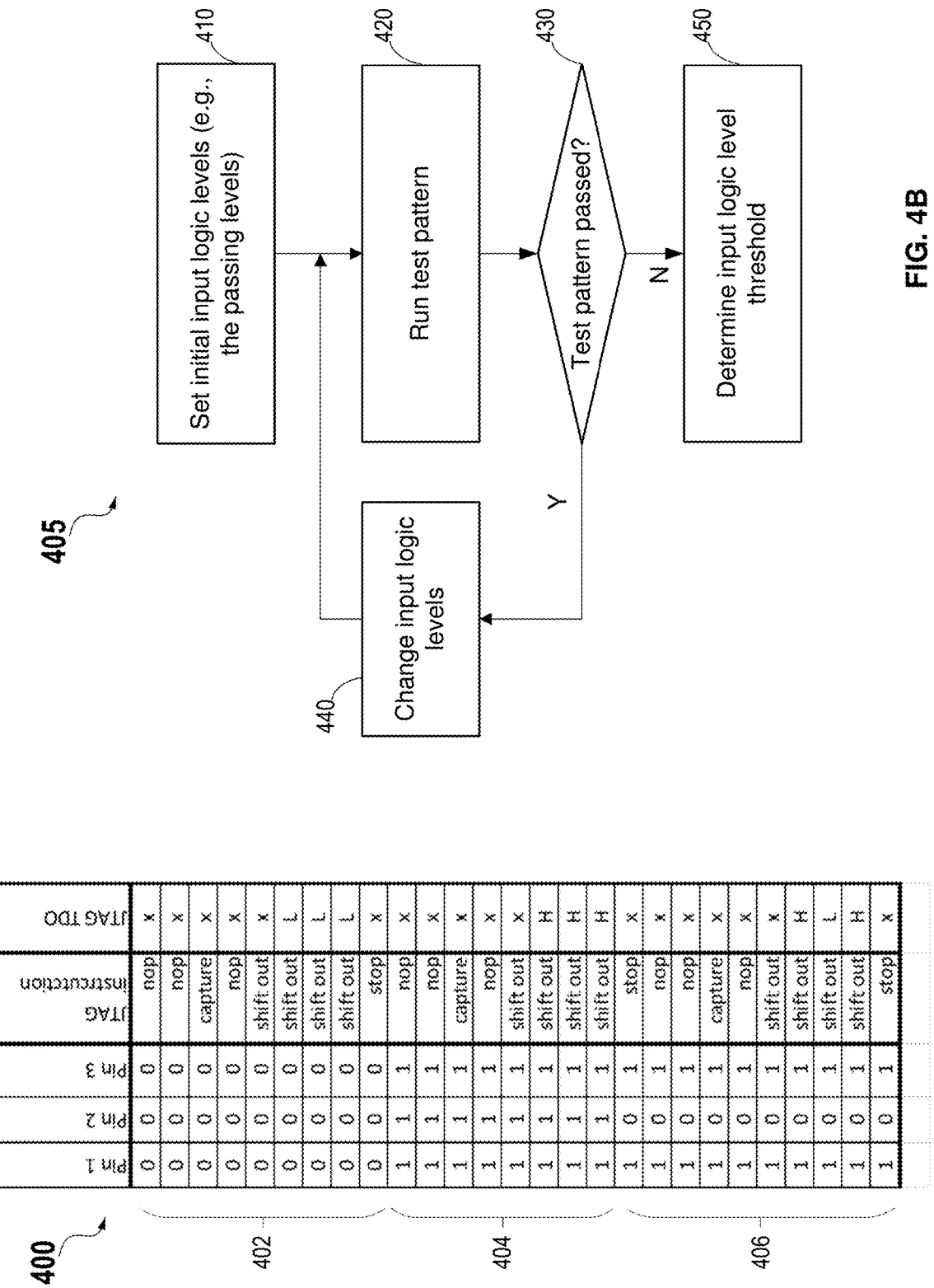
FIG. 4A illustrates an example of a simplified test pattern for testing or measuring input threshold voltage levels of input pins of a digital device including boundary scan cells.
FIG. 4B includes a flowchart illustrating an example of a method of measuring input threshold voltage levels of input pins of a digital device including boundary scan cells.

FIG. 4A illustrates an example of a simplified test pattern 400 for testing or measuring input threshold voltage levels of input pins of a digital device including boundary scan cells. Test pattern 400 may include many test vectors, where each test vector (in a row in test pattern 400) may include input values to be applied to input pins of a DUT (a logic high "1" or a logic low "0") and/or expected output values (e.g., a logic high "H," a logic low "L," a valid output "V," or do-not-care "X") on output pins of the DUT in one test clock cycle. Some test vectors may be repeated or looped based on instructions in the test pattern. In the illustrated example, test pattern 400 may include input data for three input pins (Pin1, Pin2, and Pin3), and expected output data on an output pin (e.g., TDO pin). In a first section 402 of test pattern 400, input data "000" may be respectively forced by three tester channels onto pins Pin1 to Pin3, captured and saved to the boundary scan registers, and then shifted out on the TDO pins. Thus, the TDO pin may be expected to serially output "LLL" during three clock cycles. Section 402 of the test pattern may be used to test or measure the VIL levels of pins Pin1 to Pin3. In the next section 404 of test pattern 400, input data "111" may be respectively forced by the three tester channels onto Pin1 to Pin3, captured and saved to the boundary scan registers, and then shifted out on the TDO pins. Thus, the TDO pin may be expected to serially output "HHH" during three clock cycles. Section 404 of the test pattern may be used to test or measure the VIH levels of pins Pin1 to Pin3. The next section 406 of test pattern 400 may be a checkerboard pattern, where input data "101" may be respectively forced on Pin1 to Pin3 by the three tester channels, captured and saved to the boundary scan registers, and then shifted out on the TDO pins. Thus, the TDO pin may be expected to serially output "HLH" during three clock cycles. Section 406 of the test pattern may be used to test or measure VIL/VIH levels in situations where adjacent input pins may be driven differently and may switch differently and thus the noise conditions on the input pins may be different. Other sections (not shown in FIG. 4A) of test pattern 400 may be used to test other combinations of inputs at the input pins.

During the VIL/VIH measurement, the test pattern (e.g., test pattern 400) may be loaded into the tester memory, and the timing and levels of the tester channels for the input pins and the output pins may be set, before the test pattern is executed. For example, the drive levels of the tester channels for the input pins and the compare levels of the tester channels for the output pins may be configured such that the tester channels may drive the set VIH level in a clock cycle when the corresponding input data in the test vector is "1" and may drive the set VIL level in a clock cycle when the corresponding input data in the test vector is "0," or may compare the output signal against the set VOH level in a clock cycle when the corresponding output data in the test vector is "H" and may compare the output signal against the set VOL level in a clock cycle when the corresponding output data in the test vector is "L." The timing of the input signals driven by the tester channels and the timing of strobing the output signals by the tester channels may also be set such that each tester channel may output a desired waveform or may strobe at a desired time instant. The test pattern may then be executed by the tester, during which input pins of the DUT may be driven by the tester channels according to the input data in the test pattern and the drive levels and timing information for the tester channels, and the output pins may be strobed according to the expected output data in the test pattern and the compare levels and timing information for the tester channels. If the actual output data on the output pins match the expected output values, the test pattern may pass. Otherwise, the test pattern may fail. In some cases (e.g., in production test), a test may be set up such that the test pattern may stop when a first failing test vector is encountered. In some cases (e.g., in characterization test), the test may be set up such that the test pattern may be thoroughly executed even if failing test vectors are encountered during the execution. The test results, such as the first failing test vector or clock cycle, the failing test vectors or clock cycles, and/or the number of failing test vectors or clock cycles, may be saved in the tester memory and may be read back for further processing.

FIG. 4B includes a flowchart 405 illustrating an example of a method of measuring input threshold voltage levels of input pins of a digital device including boundary scan cells. Operations described in flowchart 405 may be performed by, for example, an ATE with pin electronics described below with respect to FIG. 5. Although flowchart 405 may describe the operations as a sequential process, in various embodiments, some of the operations may be performed in parallel or concurrently. In addition, the order of the operations may be rearranged. A process may have additional steps not shown in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium or may be carried by a data carrying signal.

Initial input voltage levels may be set for tester channels for input pins at block 410. The initial input voltage levels may be at high levels (e.g., close to positive VDD) for logic high signals and at low levels (e.g., close to ground or VSS) for logic low signals, such that the test pattern may pass on a functional device. In some implementations, the initial input voltage levels may be set to values that may cause the test pattern to fail on a functional device. As described above, the power supply level, the power supply current, the compare levels (e.g., VOH and VOL levels) for output pins, the timing, clamp voltage, active load, and the like, may also be set on the tester channels. The tester may then run a tester pattern (e.g., test pattern 400) at block 420, where the test results, such as failing test vectors or clock cycles and other information may be saved to a memory device on the tester or a host. At block 430, the tester may determine if the test pattern passed on the DUT. If the test pattern passed on the DUT, the input voltage levels may be adjusted at block 440. For example, the VIH level (high output level from the tester channel) may be decreased or the VIL level (low output level from the tester channel) may be increased, and the tester may execute the test pattern again. The loop may continue until the test pattern failed on the DUT. The amount of input level adjustment in each loop may be determined based on the desired accuracy. When the amount of input level adjustment in each loop is small for high accuracy, the test pattern may need to be executed for more times, and thus the test time may be longer. At block 450, based on the input levels used in the last passing test pattern execution and/or the input levels used in the first failing test pattern execution, the VIH/VIL level for an input pin may be determined.

In some implementations, each input pin of the DUT may be tested independently and the input pins of the DUT may be tested sequentially. For example, the input signal levels for one input pin may be adjusted while the input signal levels for other pins may remain at the initial levels, and then the input signal levels for another input pin may be adjusted while the input signal levels for other pins remain at the initial levels. In some implementations, the input pins may be measured in groups, where similar pins may be arranged in a pin group. In some implementations, all input pins may be measured together, where the worst case VIL/VIH levels for all pins may be measured.

The characterization tests described above can measure the VIH/VIL levels, but generally would take long time in order to achieve high voltage resolutions and to test all pins under different operation conditions. During a production test (e.g., for screening defect devices), to reduce test time and cost, signals from tester channels on pin electronics cards of an ATE system that drive the input pins of the DUT may be set to have strong logic low levels (at or higher than the specified or guaranteed VIL level) and weak logic high levels (at or lower than the specified or guaranteed VIH level) determined based on the specification or design target, and then a functional test pattern may be run to apply digital input data at the set logic levels to the input pins and verify that the digital outputs from the device output pins have correct logic values (e.g., logic high or low levels). If the test pattern passes on the DUT, the DUT may meet the VIH/VIL specification. Otherwise, the DUT may not meet the VIH/VIL specification and may be rejected. This test may be referred to as a go-no-go test because it does not measure the actual VIH and VIL levels of the input pins.

In many applications, it may be desirable to measure the VIH/VIL levels in production test, rather than or in addition to the go-no-go test. For example, VIH/VIL levels may be measured on devices from different process lots and used to track variations in the fabrication process, which may affect other characteristics of the manufactured devices, such as speed, time margin (e.g., setup time or hold time), leakage current, power consumption, or reliability. Measured VIH/VIL levels may show how close the VIH/VIL levels of the devices are to the specification (e.g., the amount of margin). The changes in the measured VIH/VIL levels after stress test or other reliability tests may indicate the durance, reliability, and life time of the devices. However, in production test, it is generally desirable to perform the test in a short test time, in order to reduce the test cost and improve the throughput. Thus, the techniques described above with respect to FIG. 4B may not be suitable for production test.

Modern integrated circuit testers (e.g., ATE systems) generally include active termination circuitry on digital channel pin electronics cards. The active termination circuitry for a tester channel can be used to apply (e.g., source or sink) a specified amount of current to a pin of a circuit under test. For example, the active termination circuitry may be used to test the drive capability of an output driver of an output pin by forcing (sourcing) a current into the output pin to pull up the voltage level of a logic low output at the output pin and/or sinking a current from the output pin to pull down the voltage level of a logic high output at the output pin. Due to the parasitic capacitance at an input pin, applying a current to the input pin may charge or discharge the parasitic capacitor at the input pin, thereby effectively applying an analog voltage ramp to the input pin. The amplitude of the voltage ramp may be a function of the charge/discharge time and the slope, which may in turn be a function of the parasitic capacitance and the load current.

According to certain embodiments, pin electronics of digital tester channels of an ATE system may be used to apply a load current and drive signals according to a test pattern that may include multiple sections of test vectors, to generate a set of (e.g., tens or hundreds of) voltage ramps of different amplitudes at each input pin of the device under test. The length and the amplitude of a voltage ramp can be controlled by, for example, the load current, the number of test vectors in a corresponding section of the test pattern for generating the voltage ramp, and the clock cycle for running the test pattern. One voltage ramp of the set of voltage ramps or an additional voltage ramp may be used as a calibration voltage ramp for calibrating the slope of the voltage ramps at each input pin, which may depend on the loading (e.g., capacitive loading) at the input pin and the load current applied by the pin electronics. Other voltage ramps in the set of voltage ramps may be used to drive the input pin with input signals having different amplitudes, different peak voltage levels, or different minimum voltage levels. At the end of each voltage ramp, the input receiver may sense the voltage level at the input pin and determine the input state. After each voltage ramp, the input state may be shifted out to an output pin of the device, where the output values on the output pin may be compared with desired output values for corresponding input stimuli to determine whether the test vectors pass or fail on the device under test. The input threshold voltage levels (e.g., VIH/VIL levels) may be determined based on the results of the execution of the sections of the test pattern, such as the vector numbers (or clock cycle numbers) of the passing and/or failing test vectors, where the vector numbers of the passing and/or failing test vectors may be used to identify the voltage ramps that cause the passing or failing of the test vectors. The lengths of the voltage ramps identified based on the passing test and/or the failing test vectors may be determined based on the respective numbers of clock cycles used to generate the respective voltage ramps. The amplitude (or peak or minimum voltage level) of an identified voltage ramp may be determined based on the length of the voltage ramp and the slope of the voltage ramp. An input threshold voltage level may be between the peak (or minimum) voltage level of the first (or the last) voltage ramp that reaches the input threshold voltage level and thus would cause the corresponding test vectors to pass, and the peak (or minimum) voltage level of the last (or the first) voltage ramp that fails to reach the input threshold voltage level and thus would cause the corresponding test vectors to fail.

Thus, techniques disclosed herein may enable a self-calibrated input threshold voltage level test that effectively ramps the input voltage level up or down to apply input signals of different controlled voltage levels and performs inline check of the input state detected by the input receiver, for example, via, the JTAG boundary scan registers and the boundary scan interface described above. The test disclosed herein can be performed by executing one test pattern in a single shot to generate tens or hundreds of voltage ramps, capture input states by the input receiver at the end of each voltage ramp, compare the captured input states (e.g., shifted to an output pin through the boundary scan circuit) with expected values for logic high/low stimuli, and determine VIL/VIH levels based on locations of the passing test vectors and/or failing test vectors. Thus, there is no need to separately set up the pin electronics for each voltage ramp, and the test may be performed in, for example, milliseconds. In addition, all input pins may be measured in parallel by executing the same test pattern that includes input and/or output values for all pins under test, and then determining the corresponding input threshold voltage levels based on the passing and/or failing vector locations (or clock cycle numbers) associated with each respective input pin. As such, compared with existing methods where the input pins may be tested one by one in a sequential manner and where each input pin may be tested by repeatedly varying the drive levels for an input pin and running the test pattern, the test time using the techniques disclosed herein can be 2-3 orders of magnitude lower. Furthermore, techniques disclosed herein use a self-calibration process, and thus may be immune from variations, inaccuracies, or instabilities in the ATE system and/or the device setup.

Figure 5:
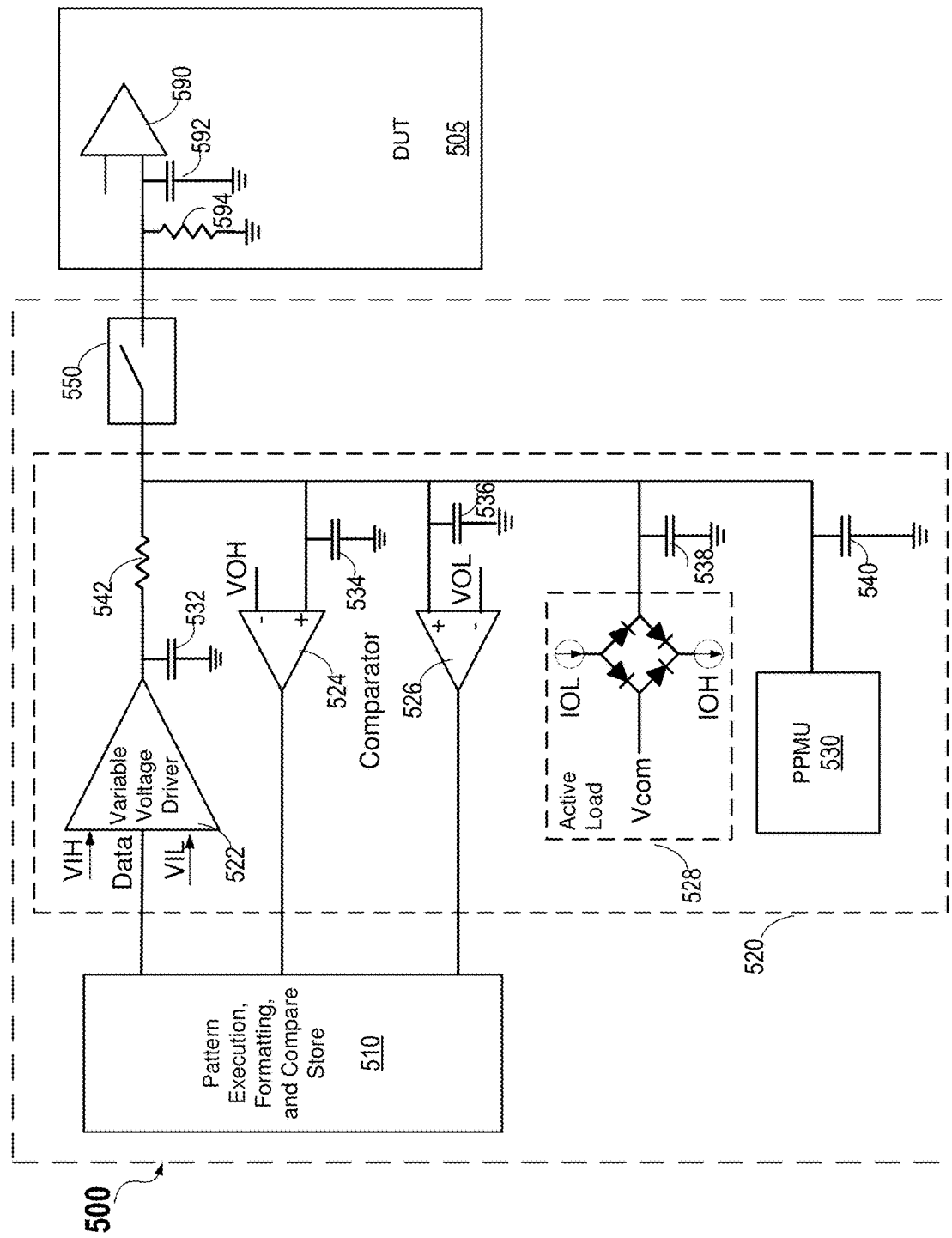
FIG. 5 illustrates an example of a pin electronics card of an automated test equipment (ATE) system.

FIG. 5 illustrates an example of a pin electronics card 520 of an automated test equipment system 500. ATE system 500 may include a pattern execution, formatting, and compare store subsystem 510 that may store test patterns and control the pattern execution and formatting of the test data supplied to pin electronics card 520 or received from pin electronics card 520. In some ATE systems, pattern execution, formatting, and compare store subsystem 510 may be part of the pin electronics card or may be integrated with the pin electronics card on a same board. In some ATE systems, a pin electronics card may include circuits for more than one tester channels, such as 8, 16, 32, 64, or 128 tester channels. A tester channel may be set to an input channel, an output channel, or both. Pin electronics card 520 may be connected to a DUT 505 through relays 550, which may be opened or closed to disconnect or connect DUT 505. DUT 505 may be positioned in a socket on a test board (e.g., a final-test load board) or may be connected to probe needles of a wafer-sort prove card. The load board or probe card may be connected to replays 550 and pin electronics card 520 through, for example, pogo pins.

In the example illustrated in FIG. 5, pin electronics card 520 may include, for each tester channel, a variable voltage driver 522, a pair of comparators 524 and 526, an active load circuit 528, and a pin precision measurement unit (PPMU) 530. Variable voltage driver 522 may generate a voltage signal at the configured VIL or VIL level in each clock cycle based on the test vector for the clock cycle. In some implementations, the output of variable voltage driver 522 may be terminated to a voltage level $V_{COM}$ or may be clamped to certain voltage levels through diodes to avoid overdriving the input pins of DUT 505. Variable voltage driver 522 may have an output resistance 542 of about 50 Ohm for impedance matching and noise reduction. The drive current can be chosen such that the developed potential is sufficient to cross the threshold voltage levels.

Comparators 524 and 526 may be used to compare the output signal from an output pin of DUT 505. For example, comparator 524 may be used to compare the output signal with a target VOH level that can be configured, and comparator 526 may be used to compare the output signal with a target VOL level that can be configured. When both the output of comparator 524 and the output of comparator 526 are high, the output signal from the output pin of DUT 505 may be a logic high signal. When both the output of comparator 524 and the output of comparator 526 are low, the output signal from the output pin of DUT 505 may be a logic low signal. When the output of one of comparator 524 and comparator 526 is low while the output of the other one of comparator 524 and comparator 526 is high, the output signal from the output pin of DUT 505 may be between the target VOL level and the target VOH level, and thus may not be a valid output signal.

Active load circuit 528 may be used to source a current IOL to DUT 505 (e.g., when the output at the DUT is low such that the DUT is sinking the current) or may be used to sink a current IOH from DUT (e.g., when the output at the DUT is high such that the DUT is sourcing current). Active load circuit 528 may be terminated to a common mode voltage Vcom, such that a low output level from DUT 505 may not be pulled above Vcom while the high output level from DUT 505 may not be pulled below Vcom. PPMU 530 may be used to measure, for example, a DC current or voltage at an input/output pin of DUT 505.

As illustrated in FIG. 5, there may be parasitic capacitance at the output of variable voltage driver 522, at the input of comparators 524 and 526, at active load circuit 528, at PPMU 530, and at device pins of DUT 505. For example, there may be a parasitic capacitor 532 at the output of variable voltage driver 522 due to, for example, the long electric interconnect between variable voltage driver 522 and input receiver 590 of the corresponding device input pin. Input pins at comparators 524 and 526 may also include parasitic input capacitors 534 and 536, respectively. Similarly, active load circuit 528 and PPMU 530 may have parasitic capacitors 538 and 540, respectively. Input receiver 590 of the device input pin may have a parasitic capacitor 592 and/or a termination resistor 594 (e.g., a 50 Ohm resistor for impedance matching or a high impedance).

According to certain embodiments, pin electronics card 520 described above may be used to generate voltage ramps, rather than only driving discrete digital input signal levels, at input receiver 590 of DUT 505 for characterizing the performance of input receiver 590. For example, based on a test pattern executed by the tester, the tester channel may first drive an initial voltage level (e.g., a high or low voltage level) on input receiver 590, and may then be switch from the drive mode to a receive mode (also referred to as a strobe or compare mode). In the receive mode, active load circuit 529 may apply a source or sink current to charge or discharge input receiver 590 and the parasitic capacitors connected to input receiver 590 as described above. Therefore, while the test pattern is executed, the voltage level at input receiver 590 may gradually increase or decrease due to the charging or discharging. As such, a voltage ramp signal may be applied to input receiver 590 over time. The length of the voltage ramp may be determined based on the number of test vectors for generating the voltage ramp and the cycle time of each clock cycle. The slope of the voltage ramp may depend on the active load current and the total capacitance of the parasitic capacitors described above. The amplitude (or the peak or the minimum level) of the voltage ramp may be determined based on the initial voltage level, the length of the voltage ramp, and the slope of the voltage ramp. Thus, voltage ramps having different peak or minimum voltage levels may be generated and applied to input receiver 590, using sections of the test pattern having different lengths. When the peak of the voltage ramp is low, input receiver 590 may not detect a logic high signal and thus a test pattern generated for a logic high input stimulus on the device pin may fail. When the peak of the voltage ramp reaches the VIH level, input receiver 590 may detect a logic high signal and thus a test pattern generated for a logic high input stimulus on the device pin may pass. Thus, the VIH level of input receiver 590 may be determined based on whether the test pattern after each voltage ramp passes or fails on the DUT.

In some implementations, ascending voltage ramps may be used to measure the VIH level, where the input signals may be captured by input receiver 590 at the end of each voltage ramp. For example, the tester channel may first apply a low voltage level on input receiver 590, and then an active load current may be supplied to the parasitic capacitors to charge the parasitic capacitors, thereby generating an ascending voltage ramp. When the ascending voltage ramp is short, the peak voltage level at the end of the voltage ramp may be lower than the VIH level, and thus a test vector generated for a logic high input stimulus and executed after the voltage ramp may fail. When the ascending voltage ramp is long, the peak voltage level at the end of the voltage ramp may be higher than the VIH level, and thus a test vector generated for a logic high input stimulus and executed after the voltage ramp may pass. Based on the result of the execution of the test pattern after each voltage ramp, the VIH level may be determined. The VIL level of input receiver 590 may also be determined in a similar manner using ascending voltage ramps generated using techniques described above and having different lengths and different voltage ranges.

In some implementations, descending voltage ramps may be used to measure the VIH level, where the input signals may be captured by input receiver 590 at the end of each voltage ramp. For example, the tester channel may first apply a high voltage level on input receiver 590, and then an active load current may be drawn from (i.e., sourced by) the parasitic capacitors to discharge the parasitic capacitors, thereby generating a descending voltage ramp. When the descending voltage ramp is short, the minimum voltage level at the end of voltage ramp may be higher than the VIH level, and thus a test vector generated for a logic high input and executed after the voltage ramp may pass. When the descending voltage ramp is long, the minimum voltage level at the end of voltage ramp may be lower than the VIH level, and thus a test vector generated for a logic high input and executed after the voltage ramp may fail. Based on the result of the execution of the test pattern after each voltage ramp, the VIH level may be determined. The VIL level of input receiver 590 may also be determined in a similar manner using descending voltage ramps generated using techniques described above and having different lengths and different voltage ranges.

Due to different loading (e.g., capacitive loading) on different input pins and the variation and inaccuracy of the active load current of each tester channel, the slope and the voltage levels of a voltage ramp may need to be calibrated. For example, the total capacitance (' at an input pin may not be known, and the active load current I applied by the active load circuit may be slightly different from the specified value, and thus the slope dv/dt of the voltage ramp may not be calculated based on dv/dt=I/C. In addition, the slope of the voltage ramps on each input pin may vary over time due to a slow variation of active load current over time.

Figure 6:
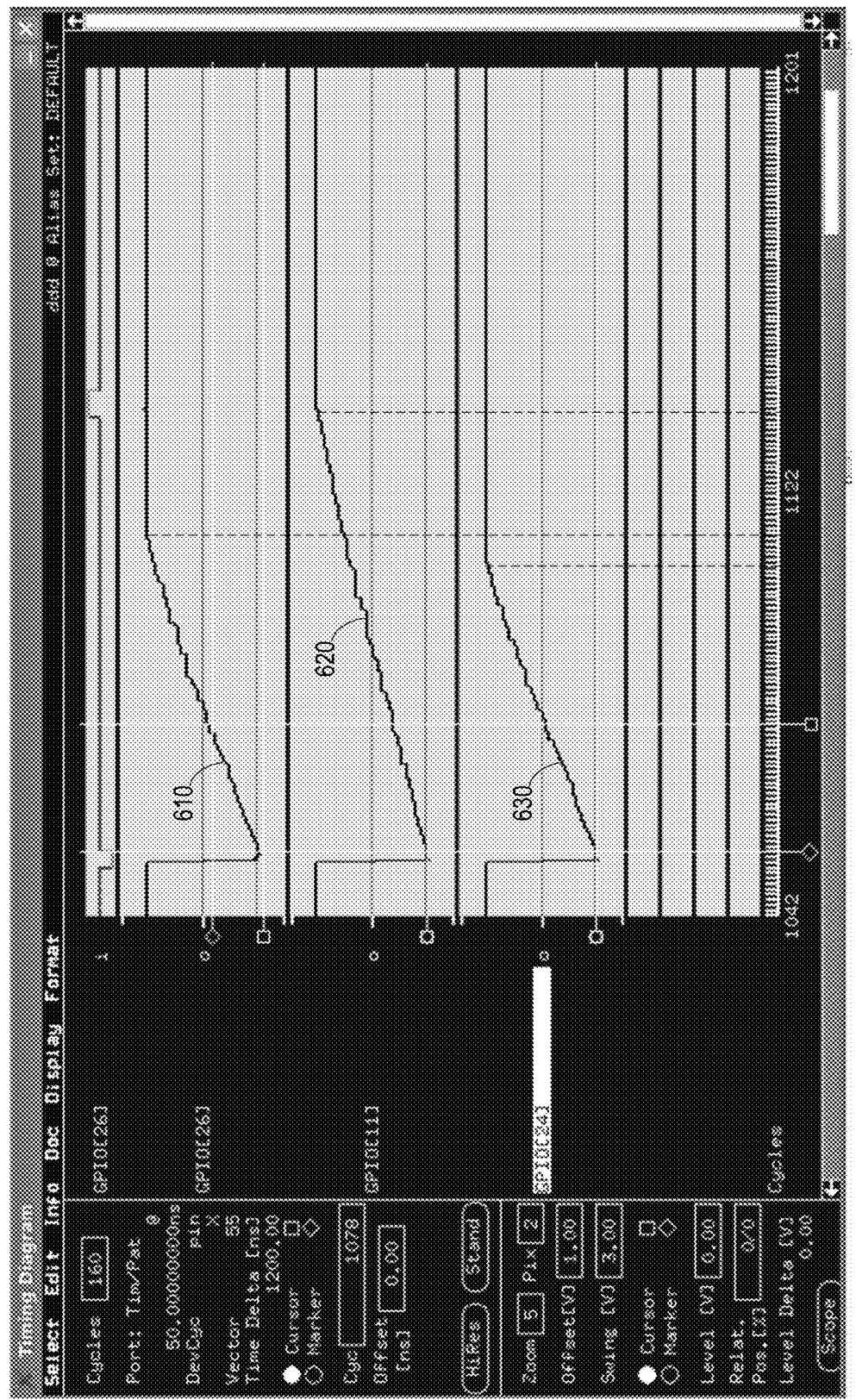
FIG. 6 illustrates examples of ramp signals on input pins with different loadings in a device under test according to certain embodiments.

FIG. 6 illustrates examples of ramp signals on input pins with different loadings in a device under test according to certain embodiments. FIG. 6 shows that the slopes of voltage ramps 610, 620, and 630 on different general-purpose input/output (GPIO) pins of the DUT may be different even if the same active load current is applied to the GPIO pins, and thus the voltage ramps may take different amounts of time to reach a same level (e.g., the Vcom level).

Therefore, the slope of the voltage ramps on each input pin may need to be measured or calibrated in order to determine the amplitude, peak voltage, and/or minimum voltage of the voltage ramp. In one example, to calibrate the slope of the voltage ramps on an input pin of a DUT under a certain load current, the test pattern for a tester channel connected to the input pin may be configured to drive an initial signal level in a drive mode, and then the tester channel may be switched to a receive mode. In the receive mode, the tester channel may apply an active load current (e.g., a source current or a sink current) on the input pin to charge or discharge the input pin of the DUT, and use a pair of comparators to compare the voltage level at the input pin in each clock cycle against a VOH level and a VOL level set for the tester channel. When the voltage level at the input pin in a clock cycle (corresponding to a test vector) is between the VOL level and VOH level, the test vector may fail because the strobed voltage level is not below the VOL level (and thus is not a logic low) and is not above the VOH level (and thus is not a logic high), and hence the voltage level is not at a valid digital output value. The number of failing clock cycles (or test vectors) may indicate the time for the tester channel to charge the voltage level at the input pin from VOL to VOH or the time for the tester channel to discharge the voltage level at the input pin from VOH to VOL.

Figure 7:
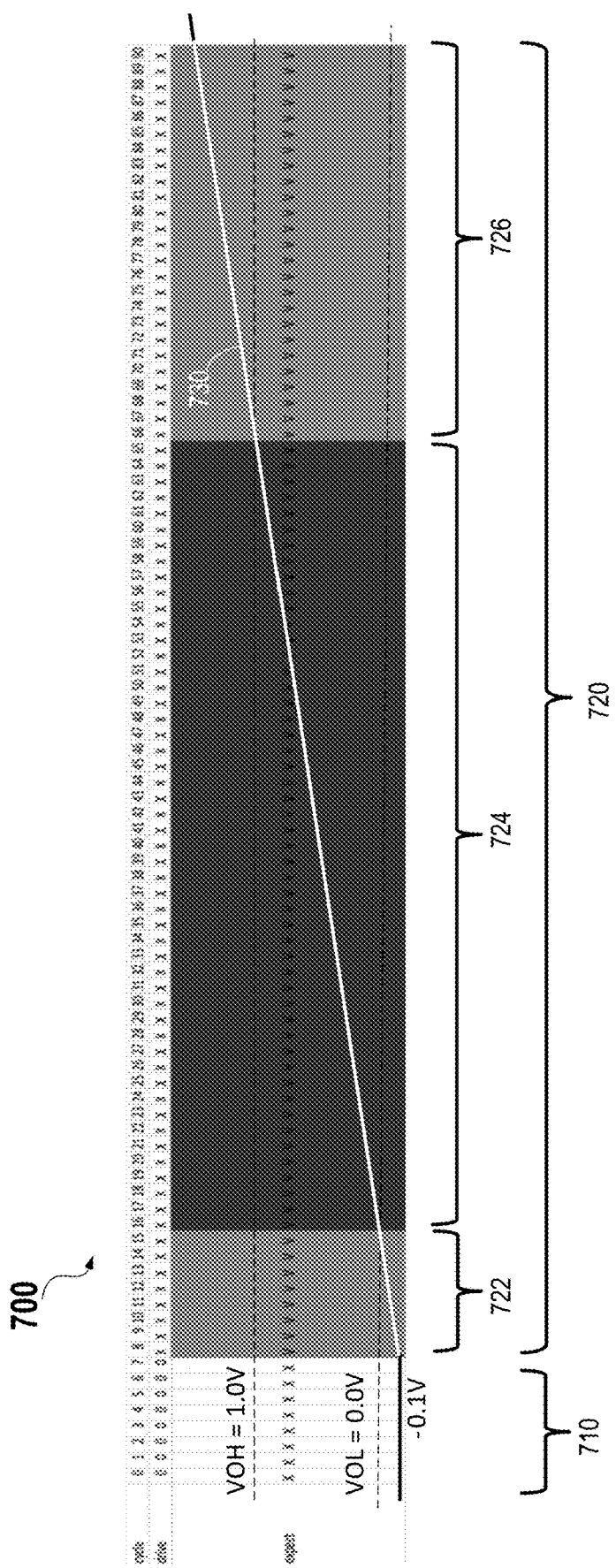
FIG. 7 illustrates an example of a calibration test pattern for generating a voltage ramp signal and measuring the slope of the voltage ramp signal according to certain embodiments.

FIG. 7 illustrates an example of a calibration test pattern 700 for generating a voltage ramp and measuring the slope of the voltage ramp according to certain embodiments. Calibration test pattern 700 may be a section of a test pattern that includes sections of test pattern for generating different voltage ramps and checking output values to measure VIL/VIH levels of input pins of a DUT. Calibration test pattern 700 may be executed before or after other sections of the test pattern. In the illustrated example, calibration test pattern 700 may include two portions 710 and 720. The first portion 710 may include 8 test vectors for driving a low voltage on an input pin. For example, the 8 test vectors may include 10s for the input pin and the VIL level of the tester channel may be set to −0.1V. Thus, when the first portion 710 is executed, the tester channel may be in the drive mode and may apply a −0.1 V voltage signal on the input pin. In the second portion 720 of calibration test pattern 700, the tester channel may be in the receive mode and may check for a valid output level at the input pin. For example, the comparators of the tester channel may compare the voltage signal on the input pin against a VOH level (e.g., set to about 1.0 V in the illustrated example) and a VOL level (e.g., set to about 0V). When the second portion 720 of calibration test pattern 700 is executed, the tester channel may source a current (e.g., about 100 μA in the illustrated example) into the input pin to pull up the level of the voltage signal at the input pin, where the Vcom for the active load circuit may be set to a high level (e.g., above 1 V, such as 2 V). Therefore, when second portion 720 of calibration test pattern 700 is executed, the level of the voltage signal at the input pin may gradually increase to generate a voltage ramp 730 at the input pin.

During the execution of second portion 720 of calibration test pattern 700, the voltage level at the input pin may be below the VOL level (e.g., 0 V) first, may then be between the VOL level and the VOH level (e.g., about 1.0 V or another value greater than 0 V), may reach and exceed the VOH level at the end. For example, when test vectors 722 are executed, the voltage level at the input pin may still be below the VOL level (e.g., 0 V), and thus the comparators of the tester channel may detect a valid logic low signal and thus each test vector of test vectors 722 may pass. During the execution of test vectors 724 of second portion 720 of calibration test pattern 700, the voltage level at the input pin may be above the VOL level but may be below the VOH level (e.g., 1.0 V), and thus the comparators of the tester channel may not detect a valid logic high or a valid logic low. Therefore, each test vector in test vectors 724 may fail the test. During the execution of test vectors 726, the voltage level at the input pin may reach and exceed the VOH level (e.g., 1.0 V), and thus the comparators of the tester channel may detect a valid logic high signal. Therefore, each test vector in test vectors 726 may pass the test.

In one example, the total capacitance (' at the input pin may be about 100 pf, the active load current I sourced by the active load circuit may be about 100 µA, the ΔV between the VOL level and the VOH level may be about 1.0 V, and thus the ramp time ΔT may be about 1000 ns according to $$I = C\frac{\Delta V}{\Delta T}.$$

Thus, if the cycle time of the clock cycle is about 20 ns (i.e., 50 MHz), test vectors 724 may include about 50 test vectors (or clock cycles).

Based on the actual number of test vectors in test vectors 724 and the cycle time of the clock cycle, the ramp time ΔT of the voltage level at the input pin from the VOL level to the VOH level (ΔV=VOH−VOL) may be calculated, and thus the slope of voltage ramp 730 with active load current I may be more accurately determined based on ΔV/ΔT, even though the exact active load current I and the total capacitance C at the input pin may not be known. Since the active load current I may be relatively constant during the short execution time of the test pattern, the slope of the voltage ramp measured using calibration test pattern 700 may be used to calculate the voltages of other voltage ramps generated using other sections of the test pattern and the same active load current I. In cases where the actual active load current of the tester channel may be close to the specified active load current, the test described above using the calibration test pattern may be used to estimate the capacitive load on an input pin according to $$C = I\frac{\Delta T}{\Delta V}.$$

Other sections of the test pattern may include test vectors for generating multiple voltage ramps having similar slopes but different lengths and thus different peak voltage levels due to the different charge/discharge times. In each section, the test vectors and the tester channel may be configured to drive an initial signal level in a drive mode, and then the tester channel may be switched to a receive mode. In the receive mode, the tester channel may apply an active load current (e.g., a source current or a sink current) on the input pin to charge or discharge the input pin, and may not strobe the signal level at the input pin using the pair of comparators or may not care about the signal level at the input pin on the DUT (e.g., the test vectors may have values "X" (do not care) for the tester channel). The input pin may be charged or discharged by the active load current in each clock cycle, such that the signal level at the input pin may gradually increase or decrease to generate a ramp signal at the input pin. The multiple sections of the test pattern may have different numbers of test vectors (or test clock cycles if one or more test vectors are repeated or looped), such that the lengths and amplitudes (or the peak or minimum voltage levels) of the voltage ramps generated by the multiple sections of the test pattern may vary (increase or decrease) gradually (e.g., linearly or nonlinearly) from voltage ramp to voltage ramp. The amplitude (or the peak or minimum voltage level) of each voltage ramp may be determined based on the calibrated slope and the length of the voltage ramp (e.g., determined based on the number of test vectors or clock cycles in the respective section of the test pattern and the cycle time of each clock cycle). In some implementations, the sections of the test pattern may use a same timeset and thus may have the same clock cycle time. In some implementations, the sections of the test pattern may use different timesets that may have different clock cycle times.

Figure 8:
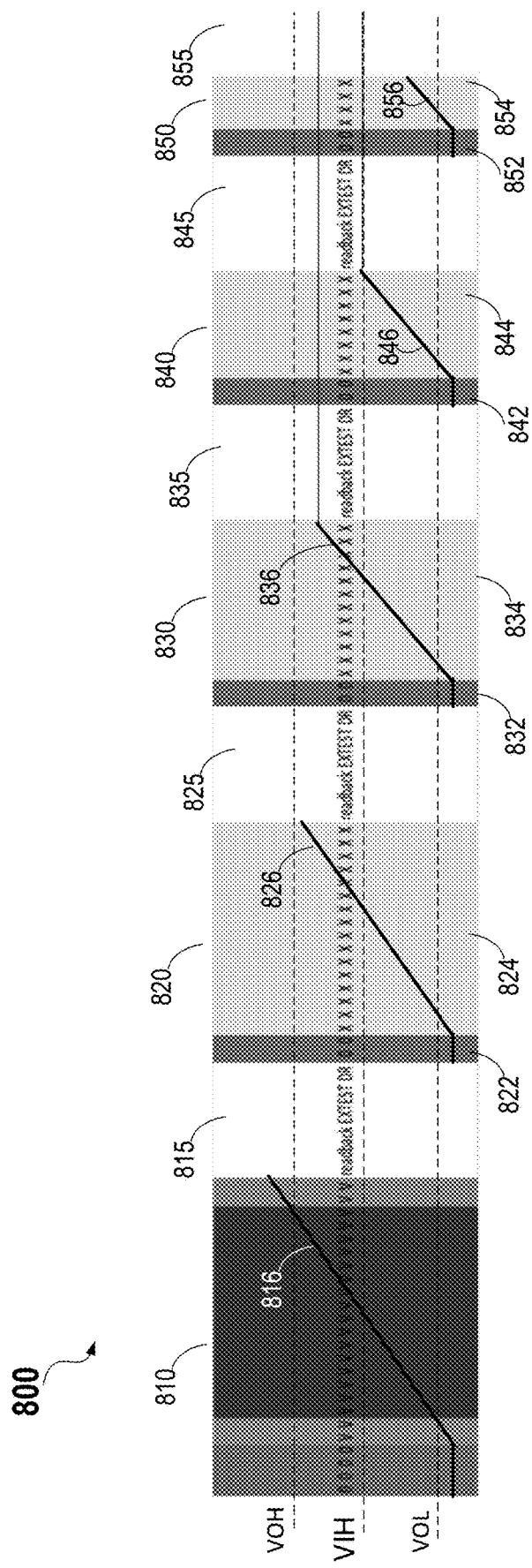
FIG. 8 illustrates an example of a test pattern including multiple sections of test vectors for generating voltage ramps of different amplitudes (or peak levels) for measuring input threshold voltage levels of input pins on a device under test (DUT) according to certain embodiments.

FIG. 8 illustrates an example of a test pattern 800 including multiple sections of test vectors for generating voltage ramps of different amplitudes or peak levels for measuring input threshold voltage levels (e.g., VIH levels) of input pins on a DUT according to certain embodiments. Test pattern 800 may also include, after each section of test pattern for each voltage ramp, output-checking test vectors including expected output values at the output pin(s) (e.g., the TDO pin) of the DUT. The output-checking test vectors may be generated based on the input threshold voltage levels to be measured. For example, if the input threshold voltage level to be measured for an input pin is VIH, the output-checking test vectors may be generated based on assuming that a logic high stimulus signal is at the input pin. Thus, the output-checking test vectors may pass if the voltage ramp reaches the VIH level of the input pin (and thus the DUT may generate expected output values on the output pins at corresponding test vectors, e.g., by shifting out the input state detected by the input receiver and stored in the boundary scan cell as described above with respect to FIGS. 2-4A). The output-checking test vectors may fail if the voltage ramp does not reach the VIH level of the input pin and thus the DUT does not generate the expected output values at the output pins in corresponding test vectors. Based on the locations of the passing test vectors and/or the failing test vectors, an ATE system may determine which voltage ramps reached the input threshold voltage level and which voltage ramps did not reach the input threshold voltage level, and may then determine the input threshold voltage levels based on the peak voltage levels of the voltage ramps that reached the input threshold voltage levels and the peak voltage levels of the voltage ramps that did not reach the input threshold voltage levels. In this way, the input threshold voltage levels of an input pin may be determined by running the test pattern once and inferring the input threshold voltage levels based on the passing and/or failing test vector locations (or clock cycle numbers). The input threshold voltage levels of multiple input pins may be determined by running the test pattern once and inferring the input threshold voltage levels based on the passing and/or failing test vector locations (or clock cycle numbers) corresponding to different input pins, since, as described above, the input states at the boundary scan registers for different input pins may be shifted out of the TDO pin in different test vectors (and in different clock cycles).

In the example illustrated in FIG. 8, test pattern 800 may be used to measure VIH levels of one or more input pins. Test pattern 800 may include a first section 810 for calibrating the slope of voltage ramps on an input pin under a certain active load current. First section 810 may be similar to calibration test pattern 700 described above and thus is not described in detail herein. Output-checking test vectors 815 may be used to check whether the voltage ramp generated using first section 810 reach the VIH levels of the input pins under test.

Section 820 may be used be generate a voltage ramp 826 that may have a peak voltage level greater than the VIH level of the input pin. For example, test vectors 822 may be used to set the tester channel to the drive mode to apply an initial voltage level (e.g., the VIL level set for the tester channel) to the input pin. Test vectors 824 may be used to set the tester channel to a receive mode, in which the tester channel may apply a load current to charge the input pin, such that the voltage level on the input pin may gradually increase to generate voltage ramp 826. In the illustrated example, section 820 may be shorter than first section 810, and thus the peak voltage level of voltage ramp 826 may be lower than the peak voltage level of voltage ramp 816. Output-checking test vectors 825 after section 820 may be used to check whether voltage ramp 826 generated using section 820 of test pattern 800 reaches the VIH level of the input pin. In the illustrated example, voltage ramp 826 may exceed the VIH level of the input pin, and thus output-checking test vectors 825 may pass.

Similarly, section 830 may be used be generate a voltage ramp 836 that may have a peak voltage level greater than the VIH level of the input pin. For example, test vectors 832 may be used to set the tester channel to the drive mode to apply an initial voltage level to the input pin. Test vectors 834 may be used to set the tester channel to a receive mode, in which the tester channel may apply a load current to charge the input pin, such that the voltage level on the input pin may gradually increase to generate voltage ramp 836. In the illustrated example, section 830 may be shorter than section 820, and thus the peak voltage level of voltage ramp 836 may be lower than the peak voltage level of voltage ramp 826. Output-checking test vectors 835 after section 830 may be used to check whether voltage ramp 836 generated using section 830 of test pattern 800 reaches the VIH level of the input pin. In the illustrated example, voltage ramp 836 may exceed the VIH level of the input pin, and thus output-checking test vectors 835 may pass.

Section 840 may be used be generate a voltage ramp 846 that may have a peak voltage level close to the VIH level of the input pin. For example, test vectors 842 may be used to set the tester channel to the drive mode to apply an initial voltage level to the input pin. Test vectors 844 may be used to set the tester channel to a receive mode, in which the tester channel may apply a load current to charge the input pin, such that the voltage level on the input pin may gradually increase to generate voltage ramp 846. In the illustrated example, section 840 may be shorter than section 830, and thus the peak voltage level of voltage ramp 846 may be lower than the peak voltage level of voltage ramp 836. Output-checking test vectors 845 after section 840 may be used to check whether voltage ramp 846 generated using section 840 of test pattern 800 reaches the VIH level of the input pin. In the illustrated example, the peak voltage level of voltage ramp 846 may be slightly above the VIH level of the input pin, and thus output-checking test vectors 845 may pass.

Section 850 may be used be generate a voltage ramp 856 that may have a peak voltage level lower than the VIH level of the input pin. For example, test vectors 852 may be used to set the tester channel to the drive mode to apply an initial voltage level to the input pin. Test vectors 854 may be used to set the tester channel to a receive mode, in which the tester channel may apply a load current to charge the input pin, such that the voltage level on the input pin may gradually increase to generate voltage ramp 856. In the illustrated example, section 850 may be shorter than section 840, and thus the peak voltage level of voltage ramp 856 may be lower than the peak voltage level of voltage ramp 846. Output-checking test vectors 855 after section 850 may be used to check whether voltage ramp 856 generated using section 850 of test pattern 800 reaches the VIH level of the input pin. In the illustrated example, voltage ramp 856 may not reach the VIH level of the input pin, and thus output-checking test vectors 855 may fail.

Thus, the VIH level of the input pin may be between the peak voltage level of voltage ramp 846 and the peak voltage level of voltage ramp 856. As described above, the peak voltage level of voltage ramp 846 and the peak voltage level of voltage ramp 856 may be determined based on the slope determined using first section 810 and voltage ramp 816, and the numbers of test vectors (or clock cycles) and the cycle times for section 840 and section 850 of test pattern 800. Therefore, the VIH level of the input pin may be determined by execute test pattern 800 once.

In another example, to measure the VIH level of an input pin, the test pattern may be configured such that the lengths and amplitudes of the voltage ramps may gradually increase. When the length and height of the voltage ramp is low, the input receiver of the input pin may not detect a logic high, and thus test vectors including expected output values for a logic high input stimulus may fail. During the execution of the test pattern, the length of the voltage ramp is gradually increased and the peak voltage level of the voltage ramp may gradually reach and then exceed the VIH level of the input pin, and thus the test vectors including expected output values for a logic high input stimulus may start to pass. Thus, the VIH level of the input pin may be determined based on the passing and/or failing vector locations (or clock cycle numbers).

Figure 9:
FIG. 9 illustrates an example of a test pattern for generating multiple voltage ramps for measuring input threshold voltage levels of input pins on a DUT according to certain embodiments.

FIG. 9 illustrates an example of a test pattern 900 for generating multiple ramp signals for measuring input threshold voltage levels of input pins on a device under test according to certain embodiments. In the illustrated example, a section 910 of test pattern 900 may be used for calibrating the slope of the voltage ramp on an input pin when a certain load current is applied to the input pin. Section 920 may be used to reset the voltage level at the input pin to the initial voltage level (e.g., the VIL level of the test channel), generate a short voltage ramp, check the outputs at one or more output pins (e.g., the TDO pin). Section 930 may be used to reset the voltage level at the input pin to the initial voltage level, generate a slightly longer voltage ramp, check the outputs at one or more output pins (e.g., the TDO pin). Other sections of test pattern may be used to generate longer and longer ramps, where the peaks of some ramps may reach or exceed the VIH level of the input pin of the device under test.

In some embodiments, a continuously increasing voltage ramp may be used to measure the VIH level of an input pin. In such embodiments, the time taken to perform the TDO readout will set the voltage ramp height resolution. For example, the input pin may be charged for a smaller number of clock cycles, and then the input signal at the input pin may be captured by the input receiver and the outputs at one or more output pins (e.g., the TDO pin of the boundary scan circuit) of the DUT may be checked, during which the input pin may still be charged and the voltage ramp may continue to rise. The input pin may be charged for a few more clock cycles, and then the input signal at the input pin may be captured again by the input receiver and the outputs at one or more output pins may be checked. The input pin may be further charged for a few more clock cycles, and the input signal at the input pin may be captured by the input receiver and the outputs at one or more output pins may be checked. After the input pin is charged for a large number of clock cycles, the voltage ramp may reach or exceed the VIH level. At or after this point, when the input signal at the input pin is captured by the input receiver, the outputs at one or more output pins may have the expected values for a logic high stimulus. When using a continuously voltage ramp in TDO readout implementations, the time taken to perform the TDO readout may affect the measurement resolution, because the input pin continues to be charged during the TDO readout.

FIG. 10A illustrates an example of a series of voltage ramps 1010-1016 generated at an input pin for measuring the VIH level of the input pin according to certain embodiments. Voltage ramps 1010-1016 may be generated using, for example, test pattern 900. The input signal may be sensed by the input receiver of the input pin at the end of each voltage ramp, and the output values at an output pin may be compared against expected values for a logic high stimulus. In the illustrated example, the peaks of voltage ramps 1010, 1012, and 1014 may be lower than the VIH level of the input pin, and thus the output-checking test vectors after voltage ramps 1010, 1012, and 1014 may fail. The peak of voltage ramp 1016 may be higher than the VIH level of the input pin, and thus the output-checking test vectors after voltage ramp 1016 may pass. Based on the locations (e.g., vector numbers or clock cycle numbers) of the failing test vectors and/or the passing test vectors, the tester or a host processor may determine the first voltage ramp (e.g., voltage ramp 1016) that causes the corresponding output-checking test vectors to pass, and determine the VIH level based on the peak voltage level of voltage ramp 1016 and the peak voltage level of the preceding voltage ramp 1014 (e.g., based on the calibrated slope, the number of test vectors or clock cycles for generating the corresponding voltage ramp, and the cycle time).

FIG. 10B illustrates an example of a voltage ramp 1020 generated at an input pin for measuring the VIH level of the input pin according to certain embodiments. Voltage ramp 1020 may be generated using, for example, test pattern 900. As voltage ramp 1020 ramps up, the input signal may be sensed multiple times by the input receiver of the input pin, and the output values at an output pin may be compared against expected values for a logic high stimulus. The tester or a host processor may determine the VIH level based on the locations (e.g., vector numbers or clock cycle numbers) of the failing test vectors and/or the passing test vectors. It should be noted that in implementations using TDO readouts, the minimum time between comparisons (e.g., the vertical dashed lines) corresponds to the TDO capture and shift time. Although this may affect the measurement resolution, the continuous ramp can also be used as the calibration ramp.

Other voltage ramps may also be used to measure the VIH levels of input pins. For example, descending voltage ramps may be generated by setting the initial voltage level at an input pin to a voltage level higher than the VIH level of the input pin, and then a load current may be used to discharge the input pin (more specifically, the parasitic capacitor at the input pin). The discharge times for different voltage ramps may be different and thus the minimum voltage levels of different voltage ramps may be different. At the end of each voltage ramp, the input signal at the input pin may be sensed, and the output values at an output pin may be compared against expected values for a logic high stimulus by executing output-checking test vectors. The output-checking test vectors may pass when the discharge time is short (and thus the voltage level is still above the VIH level of the input pin) and may fail when the discharge time is long (and thus the voltage level may be below the VIH level of the input pin). The tester or a host processor may determine the VIH level based on the locations (e.g., vector numbers or clock cycle numbers) of the failing test vectors and/or the passing test vectors as described above.

FIG. 10C illustrates an example of a series of voltage ramps 1030-1036 generated at an input pin for measuring the VIL level of the input pin according to certain embodiments. Each of voltage ramps 1030-1036 may be generated by setting the initial voltage level at the input pin to a value below the VIL level, and then applying a load current to charge the input pin and increase the voltage level at the input pin. The test pattern may be configured such that the voltage ramps generated by executing the test pattern may include voltage ramps with peak voltage levels below the VIL level (and thus the output-checking test vector may pass) and voltage ramps with peak voltage levels above the VIL level (and thus the output-checking test vector may fail). The input signal may be sensed by the input receiver of the input pin at the end of each voltage ramp, and the output values at an output pin may be compared against expected values for a logic low stimulus. In the illustrated example, the peaks of voltage ramps 1030, 1032, and 1034 may be lower than the VIL level of the input pin, and thus the output-checking test vectors after voltage ramps 1030, 1032, and 1034 may pass. The peak of voltage ramp 1036 may be higher than the VIL level of the input pin, and thus the output-checking test vectors after voltage ramp 1016 may fail. Based on the locations (e.g., vector numbers or clock cycle numbers) of the failing test vectors and/or the passing test vectors, the tester or a host processor may determine the first voltage ramp (e.g., voltage ramp 1036) that causes the corresponding output-checking test vectors to fail, and determine the VIL level based on the peak of voltage ramp 1036 and the peak of the preceding voltage ramp 1034 (e.g., based on the calibrated slope, the number of test vectors or clock cycles for generating the corresponding voltage ramp, and the cycle time).

FIG. 10D illustrates another example of a series of voltage ramps 1040-1046 generated at an input pin for measuring the VIL level of the input pin according to certain embodiments. Each of voltage ramps 1040-1046 may be generated by setting the initial voltage level at the input pin to a value above the VIL level, and then applying a load current to discharge the input pin and decrease the voltage level at the input pin. The test pattern may be configured such that the voltage ramps generated by executing the test pattern may include voltage ramps with minimum voltage levels below the VIL level (and thus the output-checking test vector may pass) and voltage ramps with minimum voltage levels above the VIL level (and thus the output-checking test vector may fail). The input signal may be sensed by the input receiver of the input pin at the end of each voltage ramp, and the output values at an output pin may be compared against expected values for a logic low stimulus. In the illustrated example, the minimum voltage levels of voltage ramps 1040, 1042, and 1044 may be greater than the VIL level of the input pin, and thus the output-checking test vectors after voltage ramps 1040, 1042, and 1044 may fail. The minimum voltage level of voltage ramp 1046 may be lower than the VIL level of the input pin, and thus the output-checking test vectors after voltage ramp 1016 may pass. Based on the locations (e.g., vector numbers or clock cycle numbers) of the failing test vectors and/or the passing test vectors, the tester or a host processor may determine the first voltage ramp (e.g., voltage ramp 1046) that causes the corresponding output-checking test vectors to fail, and determine the VIL level based on the minimum voltage level of voltage ramp 1046 and the minimum voltage level of the preceding voltage ramp 1044 (e.g., based on the calibrated slope, the number of test vectors or clock cycles for generating the corresponding voltage ramp, and the cycle time).

Other voltage ramps may also be used to measure the VIL levels of input pins. For example, a single voltage ramp (similar to voltage ramp 1020 but with a smaller slope and a lower peak voltage) may be used to measure the VIH levels. In some embodiments, the series of voltage ramps 1030-1036 or the series of voltage ramps 1040-1046 may be generated in a different sequential order and used to measure the VIL levels of input pins. For example, the test pattern may be configured such that voltage ramp 1036 may be generated first, followed by voltage ramp 1034, voltage ramp 1032, and voltage ramp 1020. Techniques described above may also be used to measure the input threshold voltage levels for differential inputs, where a respective tester channel may be used to apply voltage ramps to each end of the two ends of a differential input.

Figure 11:
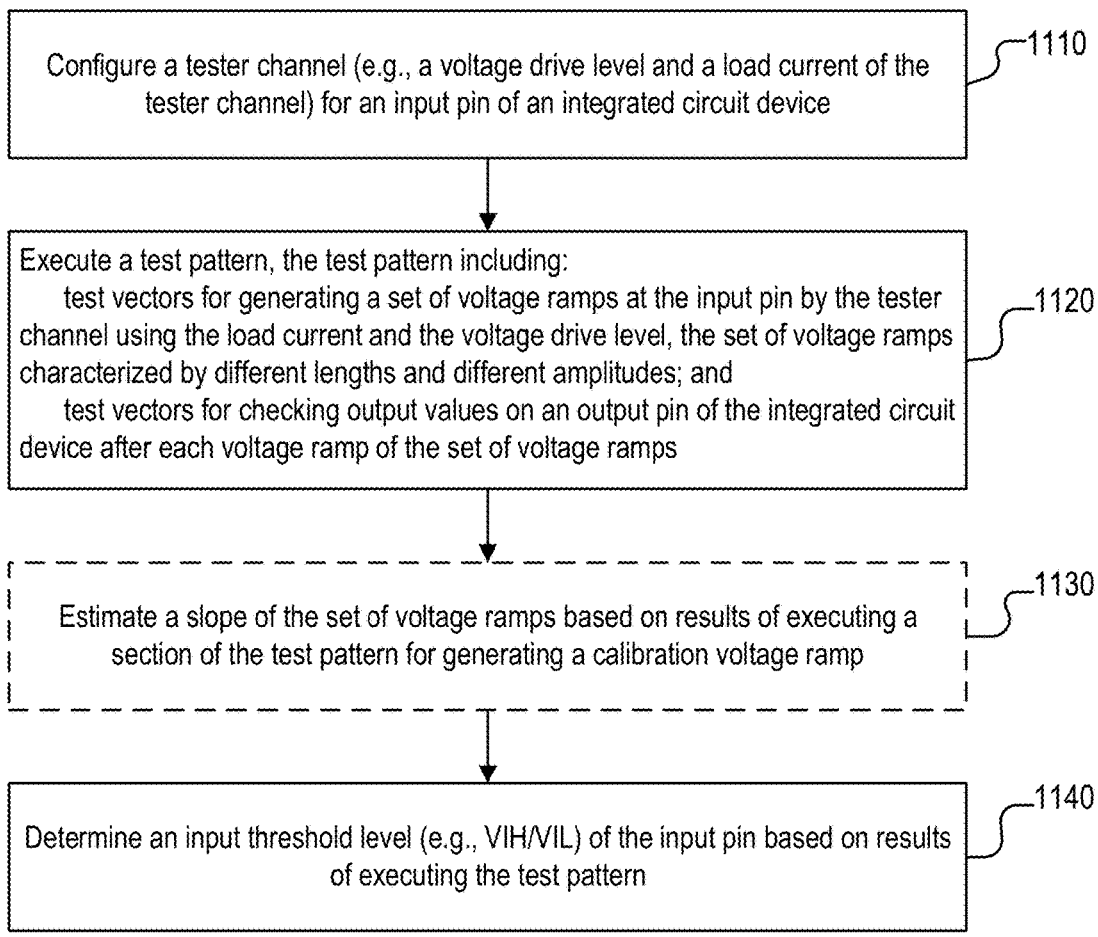
FIG. 11 includes a flowchart illustrating an example of a method for measuring input threshold voltage levels of input pins on a DUT according to certain embodiments.

FIG. 11 includes a flowchart 1100 illustrating an example of a method for measuring input threshold voltage levels of input pins on a device under test according to certain embodiments. The input threshold voltage levels may include, for example, VIL levels and VIH levels. The VIL level represents the maximum input voltage for the DUT to sense a logic 0. VIH represents the minimum input voltage for the DUT to sense a logic 1. Operations described in flowchart 1100 may be performed by, for example, an ATE system with pin electronics described above with respect to FIG. 5. Although flowchart 1100 may describe the operations as a sequential process, in various embodiments, some of the operations may be performed in parallel or concurrently. In addition, the order of the operations may be rearranged. A process may have additional steps not shown in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium or may be carried by a data carrying signal.

Operations at block 1110 may include configuring one or more tester channels for executing a test pattern. The one or more tester channels can be connected to one or more input pins of an integrated circuit device under test. A tester channel may be set to a drive mode for applying an voltage signal on an input pin of a device under test, and can also be switched to a receive mode for comparing a voltage signal at the input pin. The tester channel may also include an active load circuit for sourcing or sinking a current of a specified value, such as a few µAs, tens of µAs, or a few hundred of µAs. The tester channel and the input pin may include parasitic capacitance that may store charges corresponding to a voltage signal. Configuring the tester channel may include setting a logic high voltage drive level, a logic low voltage drive level, a load current, a clock cycle time, a logic high compare level, a logic low compare level, or a combination thereof, for the tester channel. The integrated circuit device may include a group of input pins. Each input pin of the group of input pins may include an input receiver configured to determine an input threshold voltage level at the input pin. The integrated circuit device may also include a set of boundary scan cells for the group of input pins, where the set of boundary scan cells may be arranged to form a daisy chain.

Operations at block 1120 may include executing a test pattern using the configuration of the tester channels. The test pattern may include test vectors used by a tester channel to generate a set of voltage ramps at the input pin using the load current, where the set of voltage ramps may have different lengths and different amplitudes. The set of voltage ramps may be used to measure a logic high input voltage (VIH) level of the input pin and/or a logic low input voltage (VIL) level of the input pin. In addition, the test vectors can be used to parallelly generate multiple sets of voltage ramps at multiple input pins using a group of tester channels. The test pattern may also include test vectors for checking output values on an output pin (e.g., TDO pin) of the integrated circuit device after each voltage ramp of the set of voltage ramps. The output values on the output pin may correspond to input logic levels captured by input receivers of the group of input pins and shifted out on the output pin through the daisy chain.

Executing the test pattern may cause the tester channel to generate each voltage ramp of the set of voltage ramps by applying an initial voltage level to the input pin in a drive mode, and applying, in a receive mode, the load current to the input pin for a period of time corresponding to a number of clock cycles for executing a respective section of the test pattern for generating the voltage ramp. Sections of the test pattern for generating respective voltage ramps of the set of voltage ramps may have different respective numbers of clock cycles, different respective clock cycle times, or both, so as to generate voltage ramps having different lengths and different amplitudes. The set of voltage ramps for measuring a logic high input voltage (VIH) level of the input pin may include a voltage ramp having a voltage level above the VIH level and a voltage ramp having a voltage level below the VIH level. The set of voltage ramps for measuring a logic low input voltage (VIL) level of the input pin may include a voltage ramp having a voltage level above the VIL level and a voltage ramp having a voltage level below the VIL level. The load current may include a source current for charging the input pin or a sink current for discharging the input pin, and thus the set of voltage ramps may include a linearly ascending voltage ramp or a linearly descending voltage ramp. In various embodiments, voltage ramps in the set of voltage ramps may be arranged according to an ascending order or a descending order of the respective amplitudes of the voltage ramps.

When the device under test includes a boundary scan chain, executing the test pattern may also cause the device under test to detect (by the input receiver at each input pin in the group of input pins) the input logic level (e.g., logic high "1" or logic low "0") at the input pin at the end of a voltage ramp of the set of voltage ramps, save the input logic level detected at each input pin of the group of input pins into a corresponding boundary scan cell of the set of boundary scan cells, and shift the detected input logic levels saved in the set of boundary scan cells onto the output pin of the device under test through the daisy chain. Executing the test pattern may include comparing the output values on the output pin with expected values specified in the test pattern.

Optional operations at block 1130 may include estimating a slope of the set of voltage ramps, based on results of executing a section of the test pattern for generating a calibration voltage ramp. In one example, estimating the slope of the set of voltage ramps may include setting a logic high compare level and a logic low compare level for the tester channel before executing the test pattern. The section of the test pattern may also include test vectors for comparing the voltage level of the calibration voltage ramp against the logic high compare level and the logic low compare level. The slope of the calibration voltage ramp may be determined based on the difference between the logic high compare level and the logic low compare level, and the number of clock cycles during which the voltage level of the calibration voltage ramp at the input pin is between the logic high compare level and the logic low compare level. The slope of the calibration voltage ramp may be about the same as the slope of voltage ramps in the set of voltage ramps due to the same capacitance loading and the same load current, and thus may be used, in combination with the duration of a voltage ramp (e.g., determined by the number of clock cycles and the clock cycle time for executing the section of the test pattern) to estimate an amplitude, a peak level, or a minimum level of each voltage ramp of the set of voltage ramps. In some embodiments, the slope of the set of voltage ramps may be estimated based on the load capacitance and the load current.

Operations at block 1140 may include determining an input threshold voltage level (e.g., VIH/VIL level) of the input pin based on results of executing the test pattern. As described above, based on the passing/failing vector locations (or clock cycle numbers), the first voltage ramp that cross the input threshold voltage level may be determined. Based on the slope measured using the calibration voltage ramp and the duration of the first voltage ramp, the voltage levels of the first voltage ramp may be determined, and may be used to estimate the input threshold voltage level.

Figure 12:
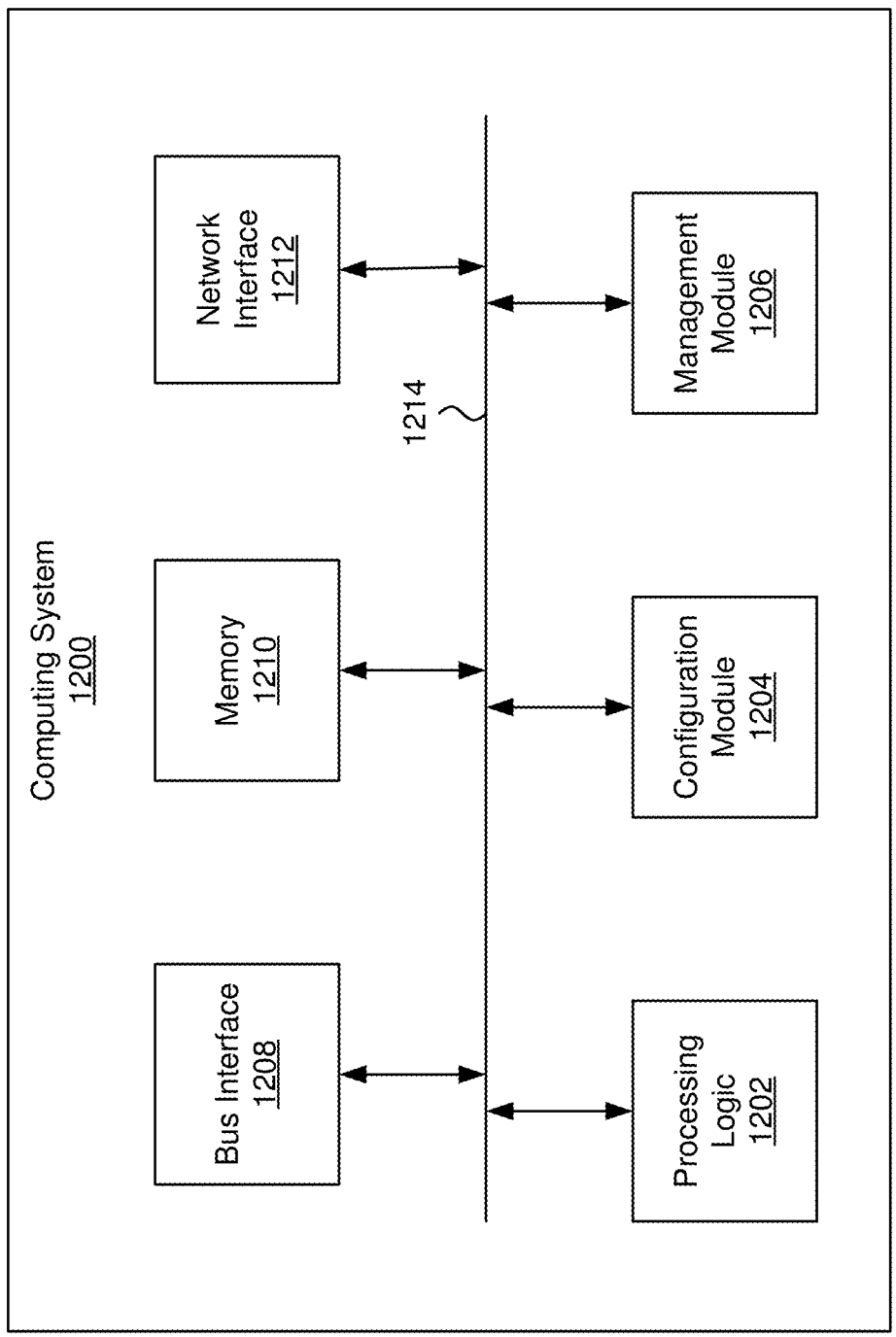
FIG. 12 illustrates an example of a computing system, according to certain aspects of the disclosure.

FIG. 12 illustrates an example of a computing system 1200. Functionality and/or several components of the computing system 1200 may be used without limitation with other embodiments disclosed elsewhere in this disclosure, without limitations. A computing system 1200 may facilitate processing of packets and/or forwarding of packets from the computing system 1200 to another device. As referred to herein, a "packet" or "network packet" may refer to a variable or fixed unit of data. In some instances, a packet may include a packet header and a packet payload. The packet header may include information associated with the packet, such as the source, destination, quality of service parameters, length, protocol, routing labels, error correction information, etc. In certain implementations, one packet header may indicate information associated with a series of packets, such as a burst transaction. In some implementations, the computing system 1200 may be the recipient and/or generator of packets. In some implementations, the computing system 1200 may modify the contents of the packet before forwarding the packet to another device. The computing system 1200 may be a peripheral device coupled to another computer device, a switch, a router or any other suitable device enabled for receiving and forwarding packets.

In one example, the computing system 1200 may include processing logic 1202, a configuration module 1204, a management module 1206, a bus interface module 1208, memory 1210, and a network interface module 1212. These modules may be hardware modules, software modules, or a combination of hardware and software. In certain instances, modules may be interchangeably used with components or engines, without deviating from the scope of the disclosure. The computing system 1200 may include additional modules, not illustrated here. In some implementations, the computing system 1200 may include fewer modules. In some implementations, one or more of the modules may be combined into one module. One or more of the modules may be in communication with each other over a communication channel 1214. The communication channel 1214 may include one or more busses, meshes, matrices, fabrics, a combination of these communication channels, or some other suitable communication channel.

The processing logic 1202 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 1202 may include processors developed by ARM®, MIPS®, AMD®, Intel®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 1202 may be stored on a computer-readable storage medium, for example, in the form of a computer program. The computer-readable storage medium may be non-transitory. In some cases, the computer-readable medium may be part of the memory 1210.

The memory 1210 may include either volatile or non-volatile, or both volatile and non-volatile types of memory. The memory 1210 may, for example, include random access memory (RAM), read only memory (ROM), Electrically Erasable Programmable Read-Only Memory (EEPROM), flash memory, and/or some other suitable storage media. In some cases, some or all of the memory 1210 may be internal to the computing system 1200, while in other cases some or all of the memory may be external to the computing system 1200. The memory 1210 may store an operating system comprising executable instructions that, when executed by the processing logic 1202, provides the execution environment for executing instructions providing networking functionality for the computing system 1200. The memory may also store and maintain several data structures and routing tables for facilitating the functionality of the computing system 1200.

In some implementations, the configuration module 1204 may include one or more configuration registers. Configuration registers may control the operations of the computing system 1200. In some implementations, one or more bits in the configuration register can represent certain capabilities of the computing system 1200. Configuration registers may be programmed by instructions executing in the processing logic 1202, and/or by an external entity, such as a host device, an operating system executing on a host device, and/or a remote device. The configuration module 1204 may further include hardware and/or software that control the operations of the computing system 1200.

In some implementations, the management module 1206 may be configured to manage different components of the computing system 1200. In some cases, the management module 1206 may configure one or more bits in one or more configuration registers at power up, to enable or disable certain capabilities of the computing system 1200. In certain implementations, the management module 1206 may use processing resources from the processing logic 1202. In other implementations, the management module 1206 may have processing logic similar to the processing logic 1202, but segmented away or implemented on a different power plane than the processing logic 1202.

The bus interface module 1208 may enable communication with external entities, such as a host device and/or other components in a computing system, over an external communication medium. The bus interface module 1208 may include a physical interface for connecting to a cable, socket, port, or other connection to the external communication medium. The bus interface module 1208 may further include hardware and/or software to manage incoming and outgoing transactions. The bus interface module 1208 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 1208 may include the physical layer for any of these bus protocols, including a connector, power management, and error handling, among other things. In some implementations, the computing system 1200 may include multiple bus interface modules for communicating with multiple external entities. These multiple bus interface modules may implement the same local bus protocol, different local bus protocols, or a combination of the same and different bus protocols.

The network interface module 1212 may include hardware and/or software for communicating with a network. This network interface module 1212 may, for example, include physical connectors or physical ports for wired connection to a network, and/or antennas for wireless communication to a network. The network interface module 1212 may further include hardware and/or software configured to implement a network protocol stack. The network interface module 1212 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing system 1200 may include multiple network interface modules, each configured to communicate with a different network. For example, in these implementations, the computing system 1200 may include a network interface module for communicating with a wired Ethernet network, a wireless 802.11 network, a cellular network, an Infiniband network, etc.

The various components and modules of the computing system 1200 described above may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 12, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A method comprising:
configuring tester channels of an automated test equipment (ATE) system for executing a test pattern, the test pattern including:
test vectors for generating a respective calibration voltage ramp and a respective set of voltage ramps at each input pin of a group of input pins of an integrated circuit device, voltage ramps in the respective set of voltage ramps having different lengths durations and different amplitudes, such that each input pin is driven to reach a first input threshold voltage level during at least one, but not all, of the voltage ramps in the respective set of voltage ramps; and
test vectors for checking output values on one or more output pins of the integrated circuit device after each voltage ramp of the respective set of voltage ramps;
executing the test pattern, wherein executing the test pattern causes the tester channels to:
set, in a drive mode, the group of input pins to initial voltage levels; and
apply, in a receive mode, a respective load current to each input pin of the group of input pins to generate the respective calibration voltage ramp and the respective set of voltage ramps at the input pin;
estimating, for each input pin of the group of input pins, a slope of the respective set of voltage ramps, based on results of executing a section of the test pattern for generating the respective calibration voltage ramp; and
determining, for each input pin of the group of input pins, input threshold voltage levels of the input pin based on the slope of the respective set of voltage ramps and results of executing the test pattern, the input threshold voltage levels of the input pin including the first input threshold voltage level.

2. The method of claim 1, wherein:
configuring the tester channels of the ATE system for executing the test pattern comprises setting a clock cycle time, a drive level, a logic high compare level, a logic low compare level, the respective load current, or a combination thereof, for each tester channel of the tester channels connected to the group of input pins;
executing the test pattern comprises executing the section of the test pattern for generating the respective calibration voltage ramp at each input pin of the group of input pins, the section of the test pattern, when executed, causing the tester channels to:
set, in the drive mode, each input pin of the group of input pins to a respective initial voltage level based on the drive level;
apply, in the receive mode, the respective load current to each input pin of the group of input pins to generate the respective calibration voltage ramp; and
compare, in the receive mode, a voltage level of the respective calibration voltage ramp at each input pin of the group of input pins against the logic high compare level and the logic low compare level; and
estimating the slope of the respective set of voltage ramps at each input pin of the group of input pins comprises dividing a difference between the logic high compare level and the logic low compare level by a product of the clock cycle time and a number of clock cycles in which the voltage level of the respective calibration voltage ramp at the input pin is between the logic high compare level and the logic low compare level.

3. The method of claim 1, wherein:
sections of the test pattern for generating respective voltage ramps in the respective set of voltage ramps have different respective numbers of clock cycles, different respective clock cycle times, or both; and
the input threshold voltage levels of the input pin include a logic high input voltage (VIH) level of the input pin and a logic low input voltage (VIL) level of the input pin.

4. The method of claim 1, wherein:
the integrated circuit device includes:
an input receiver at each input pin of the group of input pins that is configured to determine a respective input logic level at the input pin; and
a boundary scan chain including a set of boundary scan cells for the group of input pins, the set of boundary scan cells arranged in a daisy chain;
executing the test pattern causes the integrated circuit device to:
detect, by the input receiver at each input pin in the group of input pins, at an end of a voltage ramp of the respective set of voltage ramps, the respective input logic level at the input pin;
save the respective input logic level detected at each input pin of the group of input pins into a corresponding boundary scan cell of the set of boundary scan cells; and
shift, through the daisy chain, the respective input logic levels saved in the set of boundary scan cells onto an output pin of the integrated circuit device; and
executing the test pattern includes comparing output values on the output pin with expected values specified in the test pattern.

5. A method comprising:
configuring a voltage drive level and a load current for a tester channel connected to an input pin of an integrated circuit device;
executing a test pattern, the test pattern including:
test vectors for generating a set of voltage ramps at the input pin by the tester channel using the load current and the voltage drive level, wherein:
each voltage ramp in the set of voltage ramps involves driving the input pin from a same initial voltage level toward a yet-to-be-determined input threshold voltage level of the input pin, and
the voltage ramps in the set of voltage ramps are characterized by different durations and different amplitudes, such that the input pin is driven to reach the input threshold voltage level during a first voltage ramp but does not reach the input threshold voltage level during a second voltage ramp; and
test vectors for checking output values on an output pin of the integrated circuit device after each voltage ramp of the set of voltage ramps; and
determining the input threshold voltage level of the input pin based on results of executing the test pattern.

6. The method of claim 5, wherein executing the test pattern causes the tester channel to generate each voltage ramp of the set of voltage ramps by:
setting, in a drive mode, the input pin to the voltage drive level; and
applying, in a receive mode, the load current to the input pin for a period of time corresponding to a number of clock cycles for executing a respective section of the test pattern for generating the voltage ramp.

7. The method of claim 5, wherein sections of the test pattern for generating respective voltage ramps of the set of voltage ramps have different respective numbers of clock cycles, different respective clock cycle times, or both.

8. The method of claim 5, wherein:
the input threshold voltage level of the input pin includes a logic high input voltage (VIH) level of the input pin; and
the set of voltage ramps includes:
a voltage ramp having a voltage level above the VIH level; and
a voltage ramp having a voltage level below the VIH level.

9. The method of claim 5, wherein:
the input threshold voltage level of the input pin includes a logic low input voltage (VIL) level of the input pin; and
the set of voltage ramps includes:
a voltage ramp having a voltage level above the VIL level; and
a voltage ramp having a voltage level below the VIL level.

10. The method of claim 5, further comprising:
setting a logic high compare level and a logic low compare level for the tester channel before executing the test pattern, wherein the test pattern includes a section for generating a calibration voltage ramp at the input pin and comparing a voltage level of the calibration voltage ramp at the input pin against the logic high compare level and the logic low compare level; and
determining a slope of the calibration voltage ramp based on:
a difference between the logic high compare level and the logic low compare level; and
a number of clock cycles during which the voltage level of the calibration voltage ramp at the input pin is between the logic high compare level and the logic low compare level,
wherein determining the input threshold voltage level of the input pin includes determining an amplitude, a peak level, or a minimum level of a voltage ramp of the set of voltage ramps based on the slope of the calibration voltage ramp.

11. The method of claim 5, wherein:
the load current includes a source current for charging the input pin or a sink current for discharging the input pin; and
the set of voltage ramps includes a linearly ascending voltage ramp or a linearly descending voltage ramp.

12. The method of claim 5, wherein voltage ramps in the set of voltage ramps are arranged according to an ascending order or a descending order of respective amplitudes of the voltage ramps.

13. The method of claim 5, wherein:
the integrated circuit device includes:
a group of input pins;
an input receiver at each input pin of the group of input pins that is configured to determine an input logic level at the input pin; and
a set of boundary scan cells for the group of input pins, the set of boundary scan cells arranged in a daisy chain;
executing the test pattern causes the integrated circuit device to:
detect, by the input receiver at each input pin in the group of input pins, at an end of a voltage ramp of the set of voltage ramps, the input logic level at the input pin;
save the input logic level detected at each input pin of the group of input pins into a corresponding boundary scan cell of the set of boundary scan cells; and
shift, through the daisy chain, the input logic levels saved in the set of boundary scan cells onto the output pin of the integrated circuit device; and
executing the test pattern includes comparing the output values on the output pin with expected values specified in the test pattern.

14. The method of claim 5, wherein:
the test vectors for generating the set of voltage ramps at the input pin, when executed, cause a second tester channel to generate a second set of voltage ramps at a second input pin of the integrated circuit device; and
the test vectors for checking the output values on the output pin of the integrated circuit device include expected output values corresponding to input logic levels at the second input pin.

15. A non-transitory computer readable medium having stored therein instructions that, when executed by automated test equipment, cause the automated test equipment to perform operations including:
configuring a voltage drive level and a load current of a tester channel connected to an input pin of an integrated circuit device;
executing a test pattern, the test pattern including:
test vectors for generating a set of voltage ramps at the input pin by the tester channel using the load current and the voltage drive level, the set of voltage ramps characterized by different durations and different amplitudes, such that the input pin is driven to reach an input threshold voltage level during a first voltage ramp but does not reach the input threshold voltage level during a second voltage ramp; and
test vectors for checking output values on an output pin of the integrated circuit device after each voltage ramp of the set of voltage ramps; and
determining an input threshold voltage level of the input pin based on results of executing the test pattern.

16. The non-transitory computer readable medium of claim 15, wherein executing the test pattern causes the tester channel to generate each voltage ramp of the set of voltage ramps by:
setting, in a drive mode, the input pin to the voltage drive level; and
applying, in a receive mode, the load current to the input pin for a period of time corresponding to a number of clock cycles for executing a respective section of the test pattern for generating the voltage ramp.

17. The non-transitory computer readable medium of claim 15, wherein:
the input threshold voltage level of the input pin includes a logic high input voltage (VIH) level of the input pin, a logic low input voltage (VIL) level of the input pin, or both; and
the set of voltage ramps includes:
a voltage ramp having a voltage level above the VIH level or the VIL level; and
a voltage ramp having a voltage level below the VIH level or the VIL level.

18. The non-transitory computer readable medium of claim 15, wherein:
the test vectors for generating the set of voltage ramps at the input pin, when executed, cause a second tester channel to generate a second set of voltage ramps at a second input pin of the integrated circuit device; and the test vectors for checking the output values on the output pin of the integrated circuit device include expected output values corresponding to input logic levels at the second input pin.

19. The non-transitory computer readable medium of claim 15, wherein the operations further comprise:
setting a logic high compare level and a logic low compare level for the tester channel before executing the test pattern, wherein the test pattern includes a section for generating a calibration voltage ramp at the input pin and comparing a voltage level of the calibration voltage ramp against the logic high compare level and the logic low compare level; and
determining a slope of the calibration voltage ramp based on:
a difference between the logic high compare level and the logic low compare level; and
a number of clock cycles during which the voltage level of the calibration voltage ramp at the input pin is between the logic high compare level and the logic low compare level,
wherein determining the input threshold voltage level of the input pin includes determining an amplitude, a peak level, or a minimum level of a voltage ramp of the set of voltage ramps based on the slope of the calibration voltage ramp.

20. The non-transitory computer readable medium of claim 15, wherein:
the integrated circuit device includes:
a group of input pins;
an input receiver at each input pin of the group of input pins, wherein the input receiver is configured to determine an input logic level at the input pin; and
a set of boundary scan cells for the group of input pins, the set of boundary scan cells arranged in a daisy chain;
executing the test pattern causes the integrated circuit device to:
detect, by the input receiver at each input pin in the group of input pins, at an end of a voltage ramp of the set of voltage ramps, the input logic level at the input pin;
save the input logic level detected at each input pin of the group of input pins into a corresponding boundary scan cell of the set of boundary scan cells; and
shift, through the daisy chain, the input logic levels saved in the set of boundary scan cells onto the output pin of the integrated circuit device; and
executing the test pattern includes comparing the output values on the output pin with expected values specified in the test pattern.

* * * * *